(12) United States Patent
Jeong et al.

(10) Patent No.: US 12,529,952 B2
(45) Date of Patent: *Jan. 20, 2026

(54) PHOTOMASK BLANK AND PHOTOMASK USING THE SAME

(71) Applicant: SK enpulse Co., Ltd., Pyeongtaek-si (KR)

(72) Inventors: Min Gyo Jeong, Suwon-si (KR); Seong Yoon Kim, Suwon-si (KR); Sung Hoon Son, Suwon-si (KR); Inkyun Shin, Suwon-si (KR); Suk Young Choi, Suwon-si (KR); Suhyeon Kim, Suwon-si (KR); Kyuhun Kim, Suwon-si (KR); Hyung-joo Lee, Suwon-si (KR)

(73) Assignee: SK enpulse Co., Ltd., Pyeongtaek-si (KR)

( * ) Notice: Subject to any disclaimer, the term of this patent is extended or adjusted under 35 U.S.C. 154(b) by 586 days.

This patent is subject to a terminal disclaimer.

(21) Appl. No.: 17/729,466

(22) Filed: Apr. 26, 2022

(65) Prior Publication Data

US 2022/0350237 A1 Nov. 3, 2022

(30) Foreign Application Priority Data

Apr. 30, 2021 (KR) .................. 10-2021-0056720

(51) Int. Cl.
*G03F 1/32* (2012.01)
*G01B 11/30* (2006.01)
*G03F 1/50* (2012.01)

(52) U.S. Cl.
CPC ............... *G03F 1/32* (2013.01); *G01B 11/30* (2013.01); *G03F 1/50* (2013.01)

(58) Field of Classification Search
None
See application file for complete search history.

(56) References Cited

U.S. PATENT DOCUMENTS

2007/0020534 A1* 1/2007 Yoshikawa .............. G03F 1/54
428/428
2011/0104592 A1* 5/2011 Iwashita .................. G03F 1/22
430/5

(Continued)

FOREIGN PATENT DOCUMENTS

CN 106353963 A * 1/2017 ........... G03F 1/0046
CN 109960105 A * 7/2019 ............... G03F 1/26

(Continued)

*Primary Examiner* — Martin J Angebranndt
(74) *Attorney, Agent, or Firm* — NSIP Law

(57) ABSTRACT

Disclosed is a photomask comprising: a transparent substrate; and a multi-layer light shielding pattern film disposed on the transparent substrate, wherein the multi-layer light shielding pattern film comprises: a first light shielding film; and a second light shielding film disposed on the first light shielding film and comprising a transition metal and at least one selected from the group consisting of oxygen and nitrogen, and wherein a surface roughness Wr of the measuring zone satisfies Equation 1 below:

$$0 \text{ nm} < Wr - Wo \leq 3 \text{ nm} \quad [\text{Equation 1}]$$

where, in the Equation 1 above, Wo is a surface roughness of the measuring zone before soaking and washing processes, Wr is a surface roughness of the measuring zone after soaking in SC-1 (standard clean-1) solution and washing with ozone water, and the SC-1 solution comprises $NH_4OH$, $H_2O_2$, and $H_2O$.

15 Claims, 6 Drawing Sheets

(56) References Cited

U.S. PATENT DOCUMENTS

| | | |
|---|---|---|
| 2014/0057199 A1 | 2/2014 | Iwashita et al. |
| 2015/0268552 A1* | 9/2015 | Nam .................. G03F 1/26 430/5 |
| 2016/0054650 A1* | 2/2016 | Nam .................. G03F 1/26 430/5 |
| 2016/0291451 A1* | 10/2016 | Nam .................. G03F 1/58 |
| 2017/0017151 A1 | 1/2017 | Matsushima et al. |
| 2017/0068155 A1* | 3/2017 | Shishido ............. G03F 1/30 |
| 2017/0075210 A1* | 3/2017 | Shishido ............. G03F 1/32 |
| 2017/0139316 A1* | 5/2017 | Shishido ............. G03F 1/32 |
| 2017/0168384 A1 | 6/2017 | Shishido et al. |
| 2017/0242330 A1 | 8/2017 | Hanekawa |
| 2020/0379338 A1* | 12/2020 | Shishido ............. G03F 1/54 |
| 2022/0362814 A1 | 11/2022 | Chang et al. |
| 2023/0110529 A1* | 4/2023 | Lee .................. G03F 1/46 430/5 |
| 2023/0135037 A1* | 5/2023 | Jeong ............... G03F 1/26 430/5 |

FOREIGN PATENT DOCUMENTS

| | | | | |
|---|---|---|---|---|
| CN | 111308856 A | | 6/2020 | |
| JP | 2001305713 A | * | 11/2001 | ............ G03F 1/46 |
| JP | 2007164156 A | * | 6/2007 | ............ G03F 1/38 |
| JP | 5562835 B2 | | 7/2014 | |
| JP | 2015-191218 A | | 11/2015 | |
| JP | 2016105158 A | * | 6/2016 | ............ G03F 1/46 |
| JP | 2016188997 A | * | 11/2016 | ............ G03F 1/08 |
| JP | 2016191822 A | * | 11/2016 | |
| JP | 2016197225 A | * | 11/2016 | ............ G03F 1/26 |
| JP | 2017-151427 A | | 8/2017 | |
| JP | 2018049111 A | * | 3/2018 | ............ G03F 1/20 |
| JP | 2018116263 A | * | 7/2018 | ............ G03F 1/26 |
| JP | 2020064304 A | * | 4/2020 | ............ G03F 1/38 |
| JP | 2020-074053 A | | 5/2020 | |
| JP | 6698438 B2 | | 5/2020 | |
| JP | 2021152574 A | * | 9/2021 | ............ G03F 1/26 |
| KR | 10-2009-0016210 A | | 2/2009 | |
| KR | 10-2009-0047320 A | | 5/2009 | |
| KR | 10-2010-0127864 A | | 12/2010 | |
| KR | 10-2010-0134074 A | | 12/2010 | |
| KR | 10-2011-0016739 A | | 2/2011 | |
| KR | 10-2011-0044123 A | | 4/2011 | |
| KR | 10-2013-0132925 A | | 12/2013 | |
| KR | 2014027636 A | * | 3/2014 | ............ G03F 1/38 |
| KR | 10-2016-0105931 A | | 9/2016 | |
| KR | 10-2016-0138247 A | | 12/2016 | |
| KR | 10-2020-0066178 A | | 6/2020 | |
| KR | 10-2020-0137938 A | | 12/2020 | |
| TW | I698702 | * | 7/2020 | |
| TW | 202113055 A | | 4/2021 | |

* cited by examiner

PHOTOMASK BLANK AND PHOTOMASK USING THE SAME

CROSS-REFERENCE TO RELATED APPLICATIONS

This application claims the benefit under 35 U.S.C. 119(a) of Korean Patent Application No. 10-2021-0056720 filed on Apr. 30, 2021 in the Korean Intellectual Property Office, the entire disclosure of which is incorporated herein by reference for all purposes.

BACKGROUND

1. Field

The present disclosure relates to a photomask blank and a photomask using the same.

2. Description of Related Art

Due to high integration of semiconductor devices or the like, miniaturization of circuit patterns for semiconductor devices is being required. For this reason, the importance of a lithography technique, which is a technique for developing a circuit pattern on a wafer surface using a photomask, is being further emphasized.

To develop a miniaturized circuit pattern, a light source of exposure used in an exposure process (photolithography) is required to have a shorter wavelength. Recently, ArF excimer laser (wavelength of 193 nm) or the like is used as the light source of exposure.

There are a binary mask and a phase shift mask as photomasks.

The Binary mask has a structure in which a light shielding pattern layer is formed on a transparent substrate. A transmissive portion of the Binary mask not including a light shielding film allows exposure light to be transmitted on a surface, where a pattern is formed, whereas a light shielding portion of the Binary mask including a light shielding film shields exposure light, to transfer a pattern on resist film of the surface of a wafer. However, the Binary mask may cause a problem in developing a minute pattern due to diffraction of light occurring at the edge of the transmissive portion as the pattern becomes more miniaturized.

There are Levenson type, Outrigger type, and Half-tone type as a phase shift mask. Among the above, Half-tone type phase shift mask has a structure, in which a pattern is formed with semi-transmissive films on a transparent substrate. On a surface, where a pattern is formed from the Half-tone type phase shift mask, a transmissive portion not including a semi-transmissive layer allows light for exposure to be transmitted, and a semi-transmissive portion including a semi-transmissive layer allows attenuated exposure light to be transmitted. The attenuated exposure light is allowed to have a phase difference compared to exposure light, which has transmitted the transmissive portion. Accordingly, diffraction light occurring at the edge of the transmissive portion is counteracted by the light for exposure, which has transmitted the semi-transmissive portion, and thereby the phase shift mask can form a further refined minute pattern on the surface of the wafer.

SUMMARY

A photomask according to one embodiment of the present disclosure includes: a transparent substrate; and a multi-layer light shielding pattern film disposed on the transparent substrate, wherein the multi-layer light shielding pattern film includes: a first light shielding film; and a second light shielding film disposed on the first light shielding film and including a transition metal and at least one selected from the group consisting of oxygen and nitrogen, and wherein a side surface of the multi-layer light shielding pattern film includes a measuring zone corresponding to a zone between a first spot spaced apart from a first point on an upper boundary of the first light shielding film in a direction to a lower boundary of the first light shielding film and a second spot spaced apart from a second point on a lower boundary of the second light shielding film in a direction to an upper boundary of the second light shielding film, wherein a surface roughness Wr of the measuring zone satisfies Equation 1 below:

$$0 \text{ nm} < Wr - Wo \leq 3 \text{ nm} \qquad \text{[Equation 1]}$$

where, in the Equation 1 above, $Wo$ is a surface roughness of the measuring zone before soaking and washing processes, $Wr$ is a surface roughness of the measuring zone after soaking in SC-1 (standard clean-1) solution and washing with ozone water, and the SC-1 includes $NH_4OH$, $H_2O_2$, and $H_2O$.

The SC-1 solution may include $NH_4OH$ of 14.3 wt %, $H_2O_2$ of 14.3 wt %, $H_2O$ of 71.4 wt % based on a total weight of the SC-1 solution.

The photomask may be soaked in the SC-1 solution for 800 seconds.

The ozone water may be a solution including 20 ppm of ozone in an ultrapure water based on a total weight of the ozone water.

The first spot may be spaced apart from the first point by 5 nm and the second spot may be spaced apart from the second point by 5 nm.

The first light shielding film and the second light shielding film may be disposed to form an interface between the first light shielding film and the second light shielding film.

The surface roughness Wr may be the greatest in the measuring zone corresponding to a zone including the interface.

A roughness Rz of the lower surface of the second light shielding film may be 4 nm or more.

The second light shielding film may include an upper light shielding layer, and an adhesion strengthening layer disposed between the upper light shielding layer and the first light shielding film.

The first light shielding film may include a transition metal, oxygen, and nitrogen.

The adhesion strengthening layer may include a transition metal, and an amount of the transition metal in the adhesion strengthening layer may be higher than an amount of the transition metal in the first light shielding film.

The upper light shielding layer may include a transition metal, and an amount in the transition metal of the adhesion strengthening layer may be same or higher than an amount of the transition metal in the upper light shielding layer.

A ratio of the amount of the transition metal in the adhesion strengthening layer compared to the amount of the transition metal in the first light shielding film may be 1.1 to 2.5.

A thickness of the adhesion strengthening layer may be 5 to 25 Å.

The first light shielding film may include the transition metal in an amount of 30 to 60 at %.

A sum of an amount of the oxygen and an amount of the nitrogen in the first light shielding film may be 40 to 70 at %.

The second light shielding film may include a transition metal, oxygen, and nitrogen.

The second light shielding film may include the transition metal in an amount of 50 to 80 at %.

A sum of an amount of the oxygen and an amount of the nitrogen in the second light shielding film may be 20 to 50 at %.

The transition metal may include at least one selected from the group consisting of Cr, Ta, Ti, and Hf.

A height skewness (Rsk) of an upper surface of the adhesion strengthening layer after formation of the adhesion strengthening layer may be −1 or less.

A kurtosis (Rku) of an upper surface of the adhesion strengthening layer after formation of the adhesion strengthening layer may be 7 or more.

An average of surface heights (Ra) measured across an upper surface of the adhesion strengthening layer just after formation of the adhesion strengthening layer may be 0.5 nm or more.

A mean roughness depth (Rz) of an upper surface of the adhesion strengthening layer after formation of the adhesion strengthening layer may be 6 nm or more.

A photomask blank according to another embodiment of the present disclosure includes: a transparent substrate; and a multi-layer light shielding film disposed on the transparent substrate, wherein the multi-layer light shielding film includes: a first light shielding film; and a second light shielding film disposed on the first light shielding film and including a transition metal and at least one selected from the group oxygen and nitrogen, and wherein a side surface of the multi-layer light shielding film includes a measuring zone corresponding to a zone between a first spot spaced apart from a first point on an upper boundary of the first light shielding film in a direction to a lower boundary of the first light shielding film and a second spot spaced apart from second point on a lower boundary of the second light shielding film in a direction to an upper boundary of the second light shielding film, wherein a surface roughness Wr of the measuring zone satisfies Equation 1 below:

$$0 \text{ nm} < Wr - Wo \leq 3 \text{ nm} \quad \text{[Equation 1]}$$

where, in the Equation 1 above, Wo is a surface roughness of the measuring zone before soaking and washing processes, Wr is a surface roughness of the measuring zone after soaking for 800 seconds in SC-1 (standard clean-1) solution and washing with ozone water, and the SC-1 solution includes $NH_4OH$, $H_2O_2$, and $H_2O$.

The SC-1 solution may include $NH_4OH$ of 14.3 wt %, $H_2O_2$ of 14.3 wt %, $H_2O$ of 71.4 wt % based on a total weight of the SC-1 solution.

The photomask may be soaked in the SC-1 solution for 800 seconds.

The ozone water may be a solution including 20 ppm of ozone in an ultrafine water based on a total weight of the ozone water.

The first spot may be spaced apart from the first point by 5 nm and the second spot may be spaced apart from the second point by 5 nm.

The first light shielding film and the second light shielding film may be disposed to form an interface between the first light shielding film and the second light shielding film.

The surface roughness Wr may be the greatest value in the measuring zone corresponding to a zone including the interface.

A roughness Rz of the lower surface of the second light shielding film may be 4 nm or more.

The second light shielding film may include an adhesion strengthening layer disposed between the upper light shielding layer and the first light shielding film.

The first light shielding film may include a transition metal, oxygen, and nitrogen.

The adhesion strengthening layer may include a transition metal, and an amount of the transition metal in the adhesion strengthening layer may be higher than an amount of the transition metal in the first light shielding film.

The upper light shielding layer may include a transition metal, and an amount of the transition metal in the adhesion strengthening layer may be same or higher than an amount of the transition metal in the upper light shielding layer.

A ratio of the amount of the transition metal in the adhesion strengthening layer compared to the amount of the transition metal in the first light shielding film may be 1.1 to 2.5.

A thickness of the adhesion strengthening layer may be 5 to 25 Å.

The first light shielding film may include the transition metal in an amount of 30 to 60 at %.

A sum of an amount of the oxygen and an amount of the nitrogen in the first light shielding film may be 40 to 70 at %.

The second light shielding film may include a transition metal, oxygen, and nitrogen.

The second light shielding film may include the transition metal in an amount of 50 to 80 at %.

A sum of an amount of the oxygen and an amount of the nitrogen in the second light shielding film may be 20 to 50 at %.

The transition metal may include at least one selected from the group consisting of Cr, Ta, Ti and Hf.

A height skewness (Rsk) of an upper surface of the adhesion strengthening layer after formation of the adhesion strengthening layer may be −1 or less.

A kurtosis (Rku) of an upper surface of the adhesion strengthening layer after formation of the adhesion strengthening layer may be 7 or more.

An average of surface heights (Ra) measured across an upper surface of the adhesion strengthening layer just after formation of the adhesion strengthening layer may be 0.5 nm or more.

A mean roughness depth (Rz) of an upper surface of the adhesion strengthening layer after formation of the adhesion strengthening layer may be 6 nm or more.

A method of manufacturing the semiconductor element according to another embodiment includes: disposing a light source, the photomask described above, and a semiconductor wafer, on which a resist film has been applied in a sputtering chamber; selectively transmitting an incident light from the light source through the photomask; and developing a pattern on the semiconductor wafer.

Other features and aspects will be apparent from the following detailed description and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
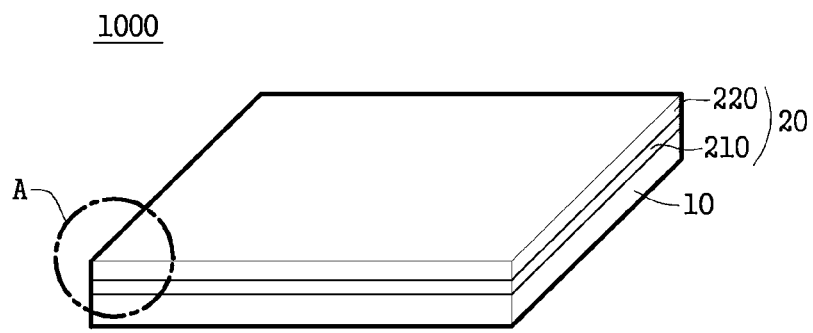
FIG. 1 is a conceptual view for illustrating a photomask blank according to one embodiment of the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

In this disclosure, the term for degree like "about", "substantially" and the like is used for meaning values approximative from/to the value when a tolerance to be proper to referred meaning for manufacture and substance is presented. Additionally, these terms for degree are used to help understanding of example embodiments and to prevent that an unconscionable trespasser unjustly uses the presented content in which exact or absolute number is referred.

Throughout this disclosure, the phrase "combination(s) thereof" included in a Markush-type expression denotes one or more mixtures or combinations selected from the group consisting of components stated in the Markush-type expression, that is, denotes one or more components selected from the group consisting of the components are included.

Throughout this disclosure, the description of "A and/or B" means "A, B, or A and B."

Throughout this disclosure, terms such as "first", "second", "A", or "B" are used to distinguish the same terms from each other unless specially stated otherwise.

In this disclosure, "B being placed on A" means that B is placed in direct contact with A or placed over A with another layer or structure interposed therebetween and thus should not be interpreted as being limited to B being placed in direct contact with A.

In this disclosure, a singular form is contextually interpreted as including a plural form as well as a singular form unless specially stated otherwise.

In this disclosure, room temperature refers to 20 to 25° C.

Rsk, Rku, Rq, Ra and Rz are values evaluated in accordance with ISO_4287. The Rsk value shows the height skewness of the surface profile of the measuring target. The Rku value show the kurtosis of the surface profile of the measuring target. Ra value shows an average of surface heights of the measuring target. Rz value shows a mean roughness depth of the measuring target.

However, the Rz value of the lower surface of the second light shielding film or the adhesion strengthening layer is obtained as follows: a sectional image of a photomask blank or a photomask is measured by using TEM (Transmission Electron Microscopy), the lower surface of the second light shielding film or the adhesion strengthening layer is traced from the sectional image, and subsequently the Rz value of the boundary surface, which has been traced, is calculated in accordance with ISO_4287.

A process of forming an exposure pattern on a semiconductor wafer is indispensable in the manufacture of a semiconductor element. In detail, on the semiconductor wafer, in which a resist layer has been formed on the surface thereof, a photomask including a designed pattern is placed, and exposure is performed through a light source. In such a case, the resist layer on the semiconductor wafer is modified, and a resist pattern may be formed by treating the resist layer with a developing solution. Through repetition of such processes, wiring of semiconductor elements may be formed.

According to high integration of a semiconductor, further miniaturized circuit pattern is required. Conventionally, to form a miniaturized pattern on a semiconductor wafer, a light, whose wavelength is shorter than a wavelength of an exposure light applied, is recommended to be applied. As an exposure light for the formation of a miniaturized pattern, for example, ArF excimer laser (wavelength of 193 nm) may be applied.

A cleaning process is necessarily applied in a process of forming a minute pattern on a photomask blank. As a cleaning process, an ordinary cleaning method, which may be performed for removing organic matter and other foreign matter generated in a process of developing a minute pattern on a light shielding film of a photomask black, or an enhanced cleaning method, which may be performed for finely controlling the Critical Dimension (called as CD below) of a light shielding film pattern formed on the surface of a photomask, may be applied. Particularly, objectives of the enhanced cleaning method include such as fine control of CD of a light shielding film pattern through a chemical reaction of the light shielding pattern with a cleaning solution and a longer time for cleaning treatment compared to an ordinary cleaning method.

Incidentally, a light shielding film may be formed to have a multi-layer structured in consideration of optical properties, etching characteristics, and the like. The light shielding film may be damaged by a cleaning solution or the like during a cleaning process. Particularly, in case of a light shielding film with a multi-layer structure, damage may occur easily in an area around an interlayer boundary, within the side surface of the light shielding film, which is exposed to a cleaning solution.

Accordingly, the inventors of the present disclosure confirmed that, when a light shielding film having multi-layer structure, which can enhance durability against a cleaning solution, is applied and roughness characteristics by layers of the light shielding film is controlled, a light shielding film having excellent optical properties and stable durability simultaneously may be obtained even though a cleaning process for a comparatively long time is applied.

Hereinafter, example embodiments will be described in further detail.

Figure 2:
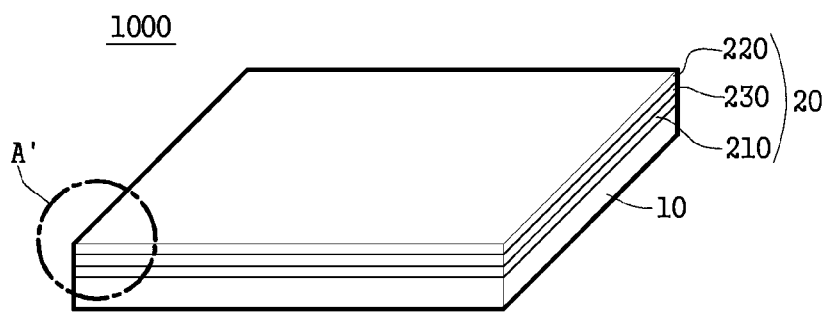
FIG. 2 is a conceptual view for illustrating a photomask blank according to another embodiment of the present disclosure.
Figure 3:
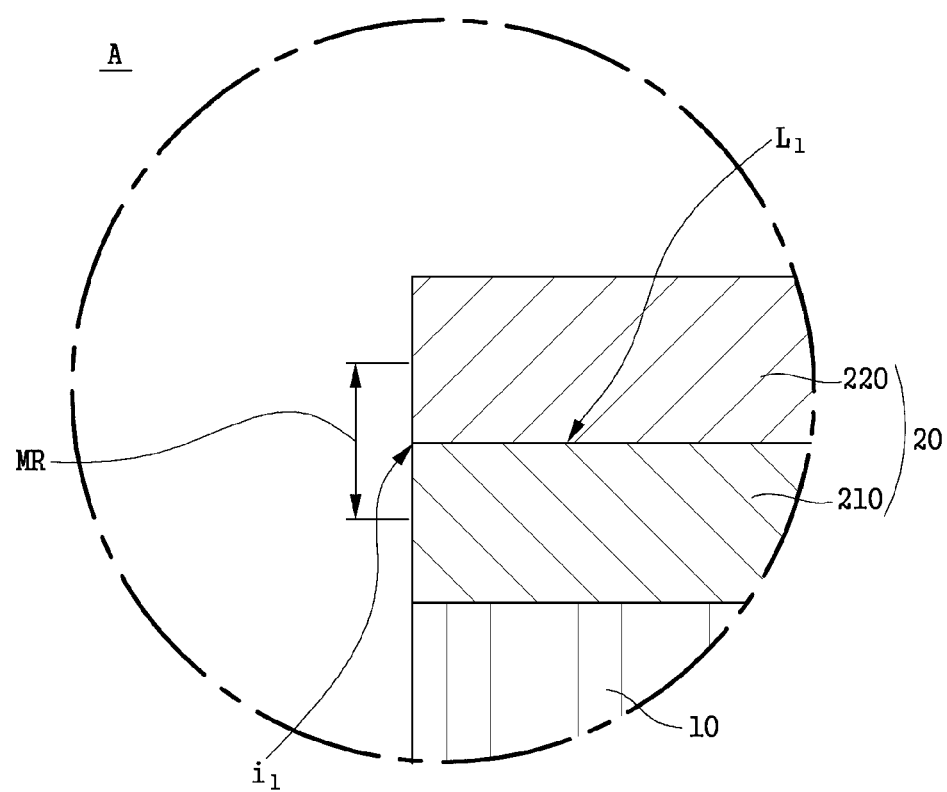
FIG. 3 is a magnified view of a portion indicated as A of FIG. 1.
Figure 4:
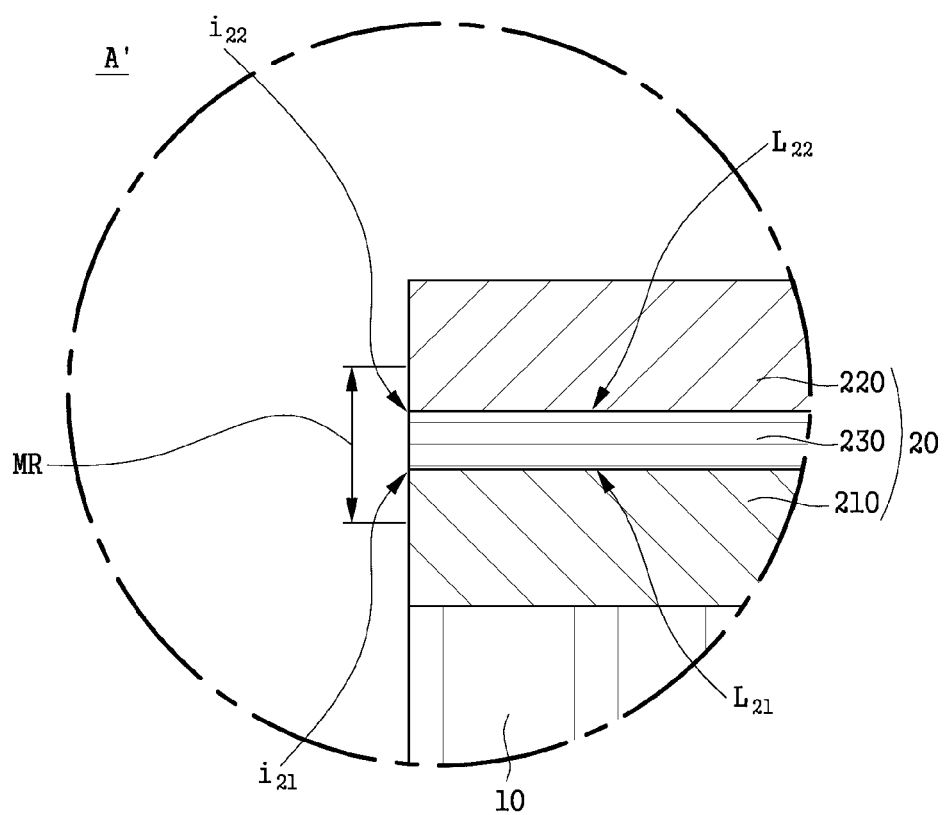
FIG. 4 is a magnified view of a portion indicated as A' of FIG. 2.
Figure 5:
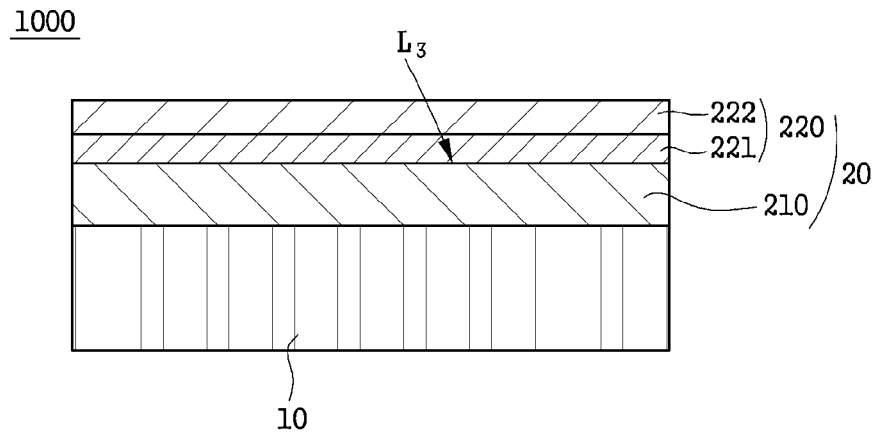
FIGS. 5 and 6 are conceptual views for illustrating a photomask according to another embodiment of the present disclosure.

FIG. 1 is a conceptual view for illustrating a photomask blank according to one embodiment of the present disclosure. FIG. 2 is a conceptual view for illustrating a photomask blank according to another embodiment of the present disclosure. FIG. 3 is a magnified view of a portion indicated as A of FIG. 1. FIG. 4 is a magnified view of a portion indicated as A' of FIG. 2. FIG. 5 is conceptual view for illustrating a photomask according to another embodiment of the present disclosure. With reference to the FIGS. 1 to 5, example embodiments are described below in further detail.

Structure and Roughness Characteristics of Multi-Layer Light Shielding Film

In a general aspect, a photomask blank 1000 according to one embodiment disclosed in the present disclosure includes a transparent substrate 10 and a multi-layer light shielding film 20 disposed on the transparent substrate 10.

The material of the transparent substrate 10 is not limited when the material has a transparent characteristic with respect to an exposure light to be applied to a photomask. Specifically, the transmission rate with respect to an exposure light with a wavelength of 193 nm of the transparent substrate 10 may be 85% or more. The transmission rate may be 87% or more. The transmission rate may be 99.99% or less. For example, the transparent substrate 10 may be a synthetic quartz substrate. In such a case, the transparent substrate 10 can suppress attenuation of a light transmitting the transparent substrate 10.

In addition, the transparent substrate 10 can suppress an occurrence of optical distortion by adjusting surface characteristics such as flatness and roughness.

The multi-layer light shielding film 20 may be disposed on the front side of the transparent substrate 10.

The multi-layer light shielding film 20 can block an exposure light incident from the back side of the transparent substrate 10. Also, when another thin film such as a phase shift 30 is disposed between the transparent substrate 10 and a multi-layer light shielding film 20, the multi-layer light shielding film can be used as an etching mask in a process of etching the thin film above.

The photomask blank 1000 has a cubic shape having a bottom plane and a front plane facing each other, and a side plane. The bottom plane refers to a surface in the side of the transparent substrate 10 within the photomask blank 1000. The front plane refers to a surface in the side of thin films like the multi-layer light shielding film 20 within the photomask blank 1000. The side plane of the photomask blank 1000 includes side surfaces of the transparent substrate 10 and the multi-layer light shielding film 20.

The multi-layer light shielding film 20 includes a first light shielding film 210 and a second light shielding film 220 disposed on the first light shielding film 210 and including a transition metal and at least one selected from the group consisting of oxygen and nitrogen.

The second light shielding film 220 may be disposed in contact with the first light shielding film 210. In such a case, an interface ($L_1$) may be formed between the first light shielding film 210 and the second light shielding film 220. That is, the upper surface (boundary) of the first light shielding film 210 and the lower surface (boundary) of the secondary light shielding film 220 may contact directly to form the interface ($L_1$) (Refer to FIG. 1 and FIG. 3).

Another thin film 230 may be placed between the first light shielding film 210 and the second light shielding film 220. As one example, when the another thin film 230 is placed between the first light shielding film 210 and the second light shielding film 220 to be contacted with the first light shielding film 210 and second light shielding film 220, respectively, a first interface ($L_{21}$) may be formed between the first light shielding film 210 and the another thin film 230, and a second interface ($L_{22}$) may be formed between the second light shielding film 220 and the another thin film 230 (Refer to FIG. 2 and FIG. 4). That is, the upper surface (boundary) of the first light shielding film 210 and the lower surface (boundary) of the another thin film 230 may be directly contacted to form a first interface ($L_{21}$), and the lower surface (boundary) of the second light shielding film 220 and the upper surface (boundary) of the another thin film 230 may be directly contacted to form a second interface ($L_{22}$).

The side surface of the multi-layer light shielding film 20 includes a measuring zone (MR) corresponding to a zone between a first spot spaced apart from a first point on an upper boundary of the first light shielding film to the direction of the lower boundary of the first light shielding film 20 and a second spot spaced apart from a second point on a lower boundary of the second light shielding film to the direction of the upper boundary of the second light shielding film 220. The side surface of the multi-layer light shielding film 20 includes a measuring zone (MR) corresponding to a zone between a first spot spaced apart by 5 nm from a first point on the upper boundary of the first light shielding film to the direction of the lower boundary of the first light shielding film 210 and a second spot spaced apart by 5 nm from a second point on the lower boundary of the second light shielding film to the direction of the upper boundary of the second light shielding film 220. That is, the side surface of the multi-layer light shielding film 20 includes a measuring zone (MR) corresponding to a zone between the first spot spaced apart by 5 nm from the first point ($i_{21}$) on the upper boundary of the first light shielding film 210 to the direction of the lower boundary of the first light shielding film 210 and the second spot spaced apart by 5 nm from the second point ($i_{22}$) on the lower boundary of the second light shielding film 220 to the direction of the upper boundary of the second light shielding film 220.

The photomask blank 1000 has a surface roughness Wr satisfying the condition of Equation 1 below in the measuring zone (MR).

$$0 \text{ nm} < Wr - Wo \leq 3 \text{ nm} \quad \text{[Equation 1]}$$

In the Equation 1, the Wo may be a surface roughness [unit: nm] of the measuring zone (MR) before soaking and washing processes, and the Wr may be a surface roughness [unit: nm] of the measuring zone (MR) after soaking in SC-1 (standard clean-1) solution including $NH_4OH$, $H_2O_2$, and $H_2O$ and washing with ozone water.

The SC-1 solution may be a solution including $NH_4OH$ of 14.3 wt %, $H_2O_2$ of 14.3 wt %, and $H_2O$ of 71.4 wt %.

The photomask may be soaked in the SC-1 solution for 800 seconds.

The ozone water may be a solution including 20 ppm of ozone in an ultrafine water based on a total weight of the ozone water.

After a patterning process of a thin film such as a light shielding film, a cleaning process may be performed to remove particles and the like remaining on the pattern. In detail, foreign matter on the pattern is removed by a cleaning solution like the above SC-1 solution, and a washing process may be performed by using ozone water. The cleaning solution and ozone water have a high reactivity with a material in the pattern, and thereby may damage the pattern during cleaning and washing processes. Particularly, in an enhanced cleaning process to control CD of the pattern, the time of exposing the pattern to a cleaning solution is longer than an ordinary cleaning process, and therefore the damage added to the pattern may be increased.

Particularly, in the case of a multi-layer structure light shielding film, respective layers included in the light shielding film may be contacted from one another to form a multi-layer structure, and respective layers may have different compositions from one another. Each adjacent layer may not have a sufficient adhesion strength due to the difference of the compositions. Accordingly, greater amount of damages may occur around the boundary between the adjacent layers within the side surface of the multi-layer light shielding film 20 exposed to the cleaning solution in the cleaning process. Due to the damage, the shape of some parts within the side surface of the multi-layer light shielding film 20 may be deformed or some of the multi-layer light shielding film 20 may be lost. In such a case, the pattern may not have a predetermined shape and thereby the photomask may have a degraded resolution in developing the pattern on the wafer surface.

The present disclosure shows technical characteristics of suppressing resolution degradation of the photomask 2000 caused from a cleaning process by limiting the difference in roughness of the side surface of the photomask blank 1000 before and after cleaning under predetermined conditions.

Hereinafter, a method of measuring surface roughness Wr and Wo of the measuring zone (MR) in the photomask blank 1000 will be described.

The measuring zone (MR) is a zone specified from TEM (Transmission Electron Microscope) image of the photomask blank 1000. The surface roughness Wr value and Wo are value obtained from TEM image of the photomask blank 1000. However, the measuring zone (MR) and the measurement of Wr and Wo may be accomplished by another device, which can measure a sectional image of the photomask blank 100 as well as TEM.

The measuring zone (MR) refers to the zone between the first spot spaced apart by 5 nm from the first point on the upper boundary of the first light shielding film in a direction to the lower boundary of the first light shielding film 210 and the second spot spaced apart by 5 nm from the second point on the lower boundary of the second light shielding film in a direction the upper boundary of the second light shielding film 220, when the side surface of the photomask blank 1000 was observed.

The first light shielding film and the second light shielding film may be arranged to form an interface between the first light shielding film and the second light shielding film. When the first light shielding film 210 and the second light shielding film 220 are placed to be contact with each other, the interface may be formed in the surface, where the first light shielding film 210 and the second light shielding film 220 contact with each other. The zone from the first spot having a distance of 5 nm from the first point ($i_1$) at the interface in the direction of the upper boundary of the photomask blank 1000 (or the photomask 2000), to the second spot having a distance of 5 nm from the second point ($i_1$) in the direction of the lower boundary of the photomask blank 1000 (or the photomask 2000) is designated as a measuring zone (MR). When the spot having a distance of 5 nm from the first point ($i_1$) in the direction of the upper boundary or the lower boundary is dislocated from the side surface zone of the multi-layer light shielding film 20, the highest end or the lowest end in the side surface zone of the multi-layer light shielding film 20 or the multi-layer light shielding pattern film 25 is designated as a measuring zone (MR) (Refer to FIG. 3).

When another thin film 230 is placed between the first light shielding film 210 and the second light shielding film 220, an interface may be formed between the first light shielding film 210 and the another thin film 230, or an interface may be formed between the second light shielding film 220 and the another thin film 230. A zone from the first spot having a distance of 5 nm from the first point ($i_{21}$) at the interface formed by the first light shielding film 210 and the another thin film 230 in a direction of the lower boundary of the first light shielding film 210, to the second spot having a distance of 5 nm from a second point ($i_{22}$) at the interface formed by the second light shielding film 220 and the another thin film 230 in a direction of the upper boundary of the second light shielding film 220 is designated as a measuring zone (MR). When the spot having a distance of 5 nm from the first point ($i_{21}$) in a direction of the lower surface is dislocated from the side surface of the multi-layer light shielding film 20 (or the multi-layer light shielding pattern film 25), a zone to the lowest end of the side surface zone of the multi-layer light shielding film 20 (or the multi-layer light shielding pattern film 25) is designated as a measuring zone (MR). When the spot having a distance of 5 nm from the second point ($i_{22}$) to the upper boundary is dislocated from the side surface of the multi-layer light shielding film 20 (or the multi-layer light shielding pattern film 25), a zone to the highest end of the side surface zone of the multi-layer light shielding film 20 (or the multi-layer light shielding pattern film 25) is designated as a measuring zone (MR) (Refer to FIG. 4).

A method of measuring the surface roughness Wr and Wo will be described as follows.

The sectional image of the side surface of the photomask blank 1000 before a cleaning process is performed is measured through TEM (Transmission Electron Microscopy). In detail, the photomask blank 1000 is processed to be a size of 15 mm wide and long, subsequently the surface of the processed photomask blank is treated by FIB (Focused Ion Beam), thereby obtaining a sample. Thereafter, TEM image of the sample is measured through TEM measuring device. For example, TEM image of the sample may be measured by using JEM-2100F HR model available from JEOL LTD.

From the TEM image, the profile of the portion corresponding to the measuring zone (MR) within the side surface of the multi-layer light shielding film 20 (or the multi-layer light shielding pattern film 25) is traced, and a Wo value is calculated form the traced line in accordance with the calculating method of Ry standardized in ISO 4287. The unit of Wo value is nm.

The method of calculating a Wr value is the same as the method of calculating a Wo value except for measuring the photomask blank 1000 (or the photomask 2000) after soaking into SC-1 solution and washing with ozone water thereof, as described above. The unit of Wr value is nm.

When Wr value is measured, the photomask blank 1000 as a measuring target is soaked to allow the multi-layer light shielding film 20 to be completely submerged in SC-1 solution. The photomask blank may be soaked for 800 seconds in Sc-1 solution and washed with ozone water. The washing with ozone water is performed to remove SC-1 solution sufficiently from the multi-layer light shielding film 20. The soaking with SC-1 solution and the washing with ozone water are performed at room temperature.

The Wr value and Wo value are measured in the measuring zone of the same locations.

The value of subtracting Wo value from Wr value means the degree of erosion of the side portion of the multi-layer light shielding film 20 in the inside direction of the photomask blank 1000 after soaking and washing processes, based on the side surface profile of the multi-layer light shielding film 20 before the soaking and washing processes are performed.

That is, when a virtual line extended along to the side surface of the photomask blank 1000 in the thickness direction of the photomask blank 1000 is defined as a reference line, the value of subtracting Wo value from Wr value means the degree of erosion of the side portion of the multi-layer light shielding film 20 in the inside direction of the photomask blank 1000 after soaking and washing processes.

The photomask blank 1000 of example embodiments may have a surface roughness value Wr in the measuring zone (MR), which satisfies the condition of Equation 1 below.

$$0 \text{ nm} < Wr - Wo \leq 3 \text{ nm} \qquad \text{[Equation 1]}$$

In the Equation 1, the Wo is a surface roughness [unit: nm] of the measuring zone (MR) before soaking and cleaning processes, and the Wr is a surface roughness [unit: nm] of the measuring zone (MR) after soaking in SC-1 (standard clean-1) solution and washing with ozone water.

The SC-1 solution may be a solution including $NH_4OH$ of 14.3 wt %, $H_2O_2$ of 14.3 wt %, and $H_2O$ of 71.4 wt %, the ozone water may be a solution 20 ppm of ozone in an ultrafine water based on a total weight of the ozone water, and the photomask may be soaked in the SC-1 solution for 800 seconds.

In such a case, the photomask blank 1000 has improved durability against a cleaning solution and a rinse solution and thereby can suppress the degradation of resolution of the photomask caused from cleaning.

The roughness Rz of the lower surface of the second light shielding film 220 may be 4 nm or more.

The second light shielding film 220 may be formed by sputtering in a target surface for the film formation of the second light shielding film 220. In such a case, the second light shielding film 220 may be formed in contact with the target surface for the film formation. The adhesion strength, the difference in the composition between the second light shielding film and the target surface for the film formation, the voltage added to the target during sputtering of the second light shielding film, and the like, may be factors affecting the surface roughness Wr value of the measuring zone (MR) of the photomask blank 1000.

Particularly, the inventors of the present disclosure confirmed that the durability of the multi-layer light shielding film 20 against cleaning may be different depending on the surface roughness of the lower surface of the second light shielding film 220 formed. This may be due to the fact that the adhesion strength between the second light shielding film 220 and the target surface for the film formation is different depending on the area, where the second light shielding film 220 and the target surface for the film formation meet. The photomask blank 1000 embodied in consideration of the above has one technical characteristic in that the adhesion strength between the second light shielding film 220 and the target surface for the film formation is enhanced to improve the durability of the multi-layer light shielding film 20 against cleaning, by controlling the surface roughness of the lower surface of the second light shielding film 220, thereby allowing the multi-layer light shielding film 20 to show comparatively uniform optical properties in the in-plane direction.

A method of measuring the roughness Rz value of the lower surface of the second light shielding film 220 will be described as follows.

The image of the section of the multi-layer light shielding film of the photomask blank 100 as a measuring target is measured through TEM. Thereafter, a lower boundary of the second light shielding film 220 is traced, and the Rz value of the lower surface of the second light shielding film 220 may be calculated from the traced line in accordance with the calculation method of Rz value standardized in ISO 4287.

In the process of measuring Rz value of the lower surface of the second light shielding film 220, the method of measuring TEM image of the photomask blank 1000 and the multi-layer light shielding film is the same as the method of measuring TEM image in the process of measuring Wr value and Wo value of the multi-layer light shielding film 20.

In the photomask blank 1000 (or the photomask 2000) as a measuring target, when the second light shielding film 220 is formed in contact with the first light shielding film 220, the lower surface (boundary) of the second light shielding film 220 may form an interface ($L_1$) by contacting with the upper surface (boundary) of the first light shielding film 210 (Refer to FIG. 3). At this time, for convenience of description, the lower surface (boundary) of the second light shielding film 220 is defined as an interface ($L_1$) between the second light shielding film 220 and the first light shielding film 210. When another thin film 230 is placed between the second light shielding film 220 and the first light shielding film 210, the lower surface (boundary) of the second light shielding film 220 may form an interface ($L_{22}$) by contacting with the upper surface (boundary) of the another thin film 230. At this time, for convenience of description, the lower surface (boundary) of the second light shielding film 220 is defined as an interface ($L_{22}$) between the second light shielding film and the another thin film 230.

The roughness Rz of the lower surface of the second light shielding film 220 may be 4 nm or more. The Rz may be 6 nm or more. The Rz may be 20 nm or less. The Rz may be 10 nm or less. In such a case, the photomask blank 1000 may have stable durability for a cleaning process with the multi-layer light shielding film 20 having comparatively uniform optical properties in the in-plane direction.

Adhesion Strengthening Layer

The second light shielding film 20 may include an upper light shielding layer 222 and an adhesion strengthening layer 221.

The adhesion strengthening layer 221 may be placed between the upper light shielding film 222 and the first light shielding film 210.

The second light shielding film 220 may be formed into a film by a sputtering method. The second light shielding film 220 may be formed into a film by sputtering on the target surface for the film formation, which is the surface of a thin film disposed in contact with the lower surface of the second light shielding film 220. The roughness value of the interface formed between the second light shielding film 220 and the thin film disposed in contact with the lower surface of the second light shielding film 220 may be different depending on the surface roughness value of the target surface of the film formation before the formation of the second light shielding film 220.

The present disclosure may apply an adhesion strengthening layer 221, whose roughness, composition, layer thickness and the like are controlled. The adhesion strengthening layer may improve the adhesion strength between the second light shielding film 220 and a thin film disposed in contact with the lower surface of the second light shielding film 220, thereby providing a photomask blank 1000 improved in the durability, CD characteristics, and the like.

The adhesion strengthening layer 221 and the first light shielding film 210 may form an interface ($L_3$) by contacting with each other. In detail, the interface ($L_3$) may be formed by the lower surface (boundary) of the adhesion strengthening layer 221 and the upper surface (boundary) of the first light shielding film 210 contacting with each other. At this time, for convenience of description, the lower surface (boundary) of the adhesion strengthening layer 221 is defined as an interface ($L_3$) between the adhesion strengthening layer 221 and the first light shielding film 210. The roughness Rz of the lower surface (boundary, $L_3$) of the adhesion strengthening layer 221 may be 4 nm or more. The Rz may be 6 nm or more. The Rz may be 20 nm or less. The Rz may be 10 nm or less. In such a case, the erosion resistance of the side portion of the multi-layer light shielding film 20 can be improved, and the variation of optical properties in the in-plane direction of the multi-layer light shielding film can be efficiently suppressed.

The method of measuring roughness of the lower surface (boundary, $L_3$) of the adhesion strengthening layer 221 is the same as the method of measuring roughness of the lower surface (boundary) of the second light shielding film 220.

The first light shielding film 210 may include a transition metal, oxygen, and nitrogen. The second light shielding film 220 may include a transition metal, oxygen, and nitrogen. The description of the composition of the first light shielding film 210 and the second light shielding film 220 is overlapped below and the further description is omitted.

An amount of a transition metal of the adhesion strengthening layer 221 may be higher than the amount of a transition metal of the first light shielding film 210. The amount of a transition metal of the adhesion strengthening layer 221 may be same or higher than the amount of a transition metal of the upper light shielding layer 222. The adhesion strengthening layer 221 and the upper light shielding layer 222 may not be substantially distinguished in the boundary.

The roughness value of an upper/a lower surface of the adhesion strengthening layer 221 formed may be different depending on factors such as the composition of the adhesion strengthening layer 221, the layer thickness, the composition of atmospheric gas injected inside a chamber during sputtering, the electric power applied to a sputtering target. Particularly, the present disclosure applies the amount ratio of active gas relative to a total atmospheric gas injected into a sputtering chamber when the adhesion strengthening layer 221 is formed into a film to be relatively lower than when the first light shielding film 210 is formed into a film. Through this, the amount of a transition metal of the adhesion strengthening layer 221 can be controlled. And the optical properties of the multi-layer light shielding film in the in-plane direction can be controlled in a certain range, and the adhesion strength between the second light shielding film 220 and a thin film disposed in contact with the lower surface of the second light shielding film 220 may be controlled in a certain range.

When the first light shielding film 210 and the second light shielding film 220 are placed in contact with each other, the thin film disposed in contact with the lower surface of the second light shielding film 220 corresponds to the first light shielding film 210 (Refer to FIG. 3). When the another thin film 230 is placed between the first light shielding film 210 and the second light shielding film 220, the thin film disposed in contact with the lower surface of the second light shielding film 220 corresponds to the another thin film 230 (Refer to FIG. 4).

The ratio of the amount of a transition metal of the adhesion strengthening layer 221 compared to the amount of a transition metal of the first light shielding film 20 may be 1.1 to 2.5. The ratio of the amount of a transition metal of the adhesion strengthening layer 221 compared to the amount of a transition metal of the first light shielding film 210 may be 1.3 to 2.3. The ratio of the amount of a transition metal of the adhesion strengthening layer 221 compared to the amount of a transition metal of the first light shielding film 210 may be 1.5 to 2.25. In such a case, it may be easy to induce the surface roughness of the adhesion strengthening layer 221 to have a higher value. In addition, it may help suppressing the particle formation caused from unevenness formed on the surface of the adhesion strengthening layer in an exposure process.

The measuring method of the amount by elements of the adhesion strengthening layer 221 is overlapped below and omitted.

The thickness of the adhesion strengthening layer 221 may be 5 to 25 Å.

The roughness value of the upper surface and the lower surface of the adhesion strengthening layer 221 may be affected by the layer thickness of the adhesion strengthening layer 221.

The adhesion strengthening layer 221 may be formed into a film through sputtering. In detail, the adhesion strengthening layer 221 may be formed by sputtered particles generated from collision of particles (for example: argon ion) with a target to be deposited on the surface of a target for film formation. In a sputtering process, deposited sputtering particles are allowed to be sporadically placed in a deposition target, form a space among the deposited particles, and control this process to form the surface of a thin film having a roughness of a predetermined size or more. As the sputtering continues, the space among particles is filled by newly deposited sputtering particles and the roughness may be gradually decreased.

The present disclosure applies a method of operating sputtering to provide an adhesion strengthening layer 221 having a film thickness, a surface roughness, and the like in a certain range.

Description of a sputtering time of the adhesion strengthening layer 221 is overlapped with the description of a manufacturing method below and therefore omitted.

The film thickness of the adhesion strengthening layer 221 may be measured through TEM image measurement.

The thickness of the adhesion strengthening layer may be 5 to 25 Å. The thickness of the adhesion strengthening layer may be 7 to 20 Å. The thickness of the adhesion strengthening layer 221 may be 10 to 15 Å. In such a case, the multi-layer light shielding film 20 may suppress the occurrence of damage against a cleaning solution and can decrease the amount of particles occurring in an exposure process.

The Composition and Film Thickness of Multi-Layer Light Shielding Film

For patterning the multi-layer light shielding film 20, dry etching may be applied. In such a case, the second light shielding film 220 is allowed to be exposed to etchant for relatively long time compared to the first light shielding film 210. When the etching characteristics of the second light shielding film 220 is supposed to be similar with the first light shielding film 210, a line width of the pattern film of the multi-layer light shielding film 20 after patterning may be gradually increased as facing the lower portion. This may be one among factors of degrading the resolution of a photomask. To suppress the above, the process condition such as the composition of each layer, the voltage of sputtering, atmospheric gas, and the like, or the thickness of each layer included in the multi-layer light shielding film can be controlled, and thereby the second light shielding film 220 can have a relatively lower etching characteristic under the same etchant condition compared to the first light shielding film 210. In such a case, the side surface of the patterned multi-layer light shielding film may be formed to be relatively closer to be vertical from the surface of a transparent substrate. Particularly, the present disclosure adjusts the composition of each light shielding film, the film thickness, and the like, and thereby can improve the convenience of shape control of the patterned multi-layer light shielding film 20.

The first light shielding film 210 may include a transition metal, oxygen, nitrogen. The first light shielding film 210 may include a transition metal in an amount of 30 to 60 at %. The first light shielding film 210 may include a transition metal in an amount of 35 to 55 at %. The first light shielding film 210 may include a transition metal in an amount of 38 to 45 at %.

The sum of the amount of the oxygen and the nitrogen in the first light shielding film 210 may be 40 to 70 at %. The sum of the amount of the oxygen and nitrogen in the first light shielding film 210 may be 45 to 65 at %. The sum of the amount of the oxygen and the nitrogen may be 50 to 60 at %.

The first light shielding film 210 may include oxygen in an amount of 20 to 35 at %. The first light shielding film 210 may include oxygen in an amount of 23 to 33 at %. The first light shielding film 210 may include oxygen in an amount of 25 to 30 at %.

The first light shielding film 210 may include nitrogen in an amount of 20 to 35 at %. The first light shielding film 210 may include nitrogen in an amount of 23 to 33 at %. The first light shielding film 210 may include nitrogen in an amount of 25 to 30 at %.

In such a case, the first light shielding film 210 may help the multi-layer light shielding film 20 to have an excellent extinction characteristic. In addition, when the multi-layer light shielding film 20 is patterned, the occurrence of dislocation, which may occur in the side surface of the multi-layer light shielding pattern film, can be suppressed.

The second light shielding film 220 may include a transition metal, oxygen, or nitrogen. The second light shielding film 220 may include a transition metal in an amount of 50 to 80 at %. The second light shielding film 220 may include a transition metal in an amount of 55 to 75 at %. The second light shielding film 220 may include a transition metal in an amount of 60 to 70 at %.

The sum of the amount of the oxygen and the nitrogen in the second light shielding film 220 may be 20 to 50 at %. The sum of the amount of the oxygen and the nitrogen in the second light shielding film 220 may be 25 to 45 at %. The sum of the amount of the oxygen and the nitrogen in the second light shielding film 220 may be 30 to 40 at %.

The second light shielding film 220 may include nitrogen in an amount of 20 to 50 at %. The second light shielding film 220 may include nitrogen in an amount of 25 to 45 at %. The second light shielding film 220 may include nitrogen in an amount of 30 to 40 at %.

In such a case, the second light shielding film may help the multi-layer light shielding film 20 to have an excellent extinction characteristic. In addition, even though the upper portion of the patterned multi-layer light shielding film is exposed for a long time to an etching gas, the multi-layer light shielding pattern film can have an even line width in the thickness direction.

The transition metal may include at least one selected from the group consisting of Cr, Ta, Ti, and Hf. The transition metal may be Cr.

The amount by elements of each film and each layer inside the multi-layer light shielding film 20 is measured through XPS (X-ray photoelectron spectroscopy). In detail, a photomask blank as a measuring target is processed to be a size of 15 mm length and width, thereby preparing a sample. Thereafter, the sample is disposed inside XPS measuring device, and the area having a width of 4 mm and a length of 2 mm is etched and the amount by elements of each film and each layer is measured.

For example, the amount by elements of each film and each layer inside the multi-layer light shielding film 20 may be measured by using K-alpha model available from Thermo Scientific.

The film thickness of the first light shielding film 210 may be 250 to 650 Å. The film thickness of the first light shielding film 210 may be 350 to 600 Å. The film thickness of the first light shielding film 210 may be 400 to 550 Å. In such a case, the first light shielding film 210 can help the multi-layer light shielding film 20 to block an exposure light effectively.

The film thickness of the second light shielding film 220 may be 30 to 200 Å. The film thickness of the second light shielding film 220 may be 30 to 100 Å. The film thickness of the second light shielding film 220 may be 40 to 80 Å. In such a case, the second light shielding film 220 can help an extinction characteristic of the multi-layer light shielding film 20, and a line width variation in the thickness of the multi-layer light shielding pattern film can be decreased.

The film thickness ratio of the second light shielding film 200 compared to the first light shielding film 210 may be 0.05 to 0.3. The film thickness ratio may be 0.07 to 0.25. The film thickness ratio may be 0.1 to 0.2. In such a case, the multi-layer light shielding film can have a sufficient extinction characteristic. Also, the side surface of the patterned multi-layer light shielding film may be formed to be close to be vertical from the surface of the transparent substrate.

The ratio of a thickness of the adhesion strengthening layer 221 compared to a thickness of the first light shielding film 210 may be 0.005 to 0.05. The ratio of the thickness of the adhesion strengthening layer 221 compared to the thickness of the first light shielding film 210 may be 0.01 to 0.04. The ratio of the thickness of the adhesion strengthening layer 221 compared to the thickness of the first light shielding film 210 may be 0.015 to 0.03. In such a case, the multi-layer light shielding film can have stable durability against a cleaning solution.

Optical Properties of Multi-Layer Light Shielding Film

The multi-layer light shielding film 20 may have an optical density of 1.8 or more for a light with a wavelength of 193 nm. The multi-layer light shielding film 20 may have an optical density of 1.9 or more for a light with a wavelength of 193 nm.

The multi-layer light shielding film 20 may have a transmittance of 1.5% or less for a light with a wavelength of 193 nm. The multi-layer light shielding film 20 may have a transmittance of 1.4% or less for a light with a wavelength of 193 nm. The multi-layer light shielding film 20 may have a transmittance of 1.2% or less for a light with a wavelength of 193 nm.

In such a case, the pattern including a multi-layer light shielding film 20 can block the transmission of an exposure light effectively.

The phase shift film may be placed between the transparent substrate 10 and the multi-layer light shielding film 20. The film including a phase shift film and the multi-layer light shielding film 20 may have an optical density of 3 or more for a light with a wavelength of 193 nm. The film including a phase shift film and the multi-layer light shielding film 20 may have an optical density of 3.2 or more for a light with a wavelength of 193 nm. In such a case, the film can suppress the transmission of an exposure light effectively.

Figure 6:
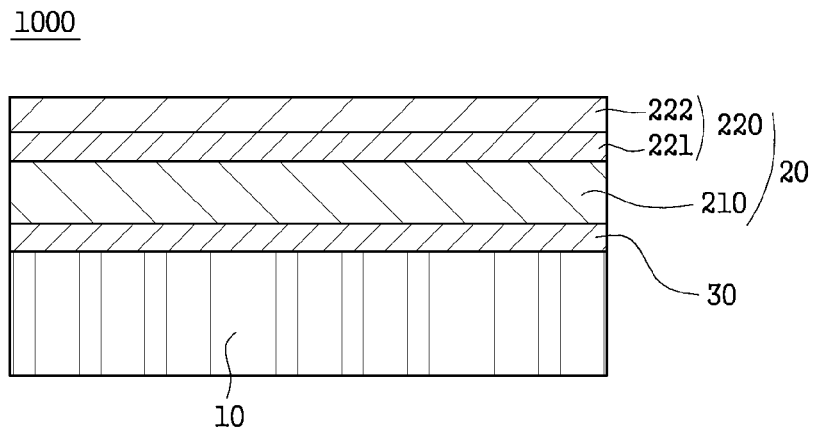

FIG. 6 is a conceptual view for illustrating a photomask blank according to another embodiment. With reference to the FIG. 6, the following will be described.

Other Thin Films

As other thin films, a phase shift film 30, a hard mask film (not shown), or the like may be included. The phase shift film 30 is a thin film for attenuating an intensity of an exposure light transmitting the phase shift film, while regulating the phase difference to suppress a diffraction light occurring in the edge of a pattern.

The phase shift film 30 may have a phase difference of 170 to 190° for a light with a wavelength of 193 nm. The phase shift film 30 may have a phase difference of 175 to 185° for a light with a wavelength of 193 nm. The phase shift film 30 may have a transmittance of 3 to 10% for a light with a wavelength of 193 nm. The phase shift film 30 may have a transmittance of 4 to 8% for a light with a wavelength of 193 nm. In such a case, the resolution of a photomask including the phase shift film 30 may be improved.

The phase shift film 30 may include a transition metal and a silicon. The phase shift film 30 may include a transition metal, silicon, oxygen, and nitrogen. The transition metal may be molybdenum.

A hard mask improves adhesion with a resist film and thereby can suppress collision of the resist film when a pattern is etched, while functioning as an etching mask film.

The hard mask may include silicon, nitrogen, and oxygen.

Figure 7:
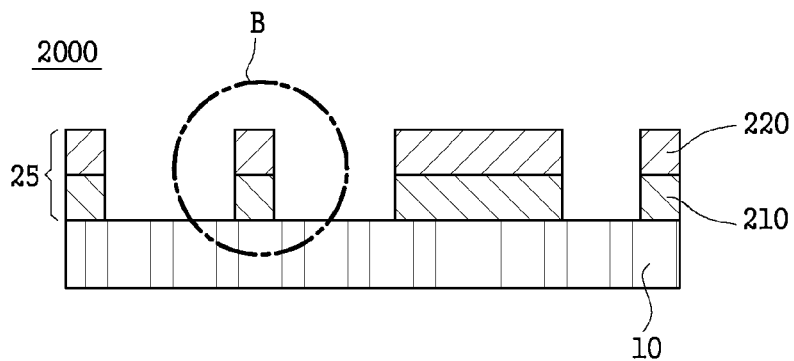
FIGS. 7 and 8 are conceptual views for illustrating a photomask according to another embodiment of the present disclosure.
Figure 8:
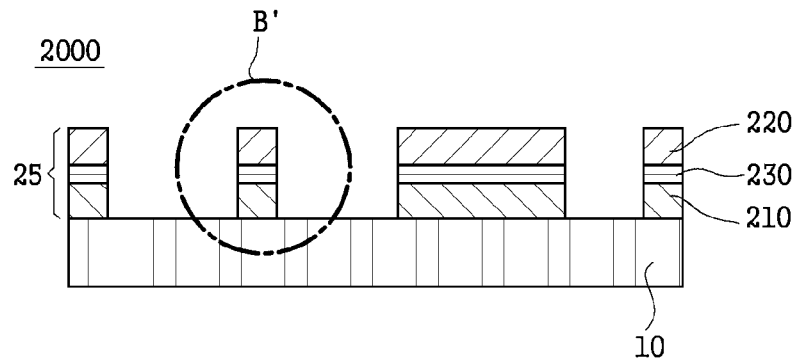
Figure 9:
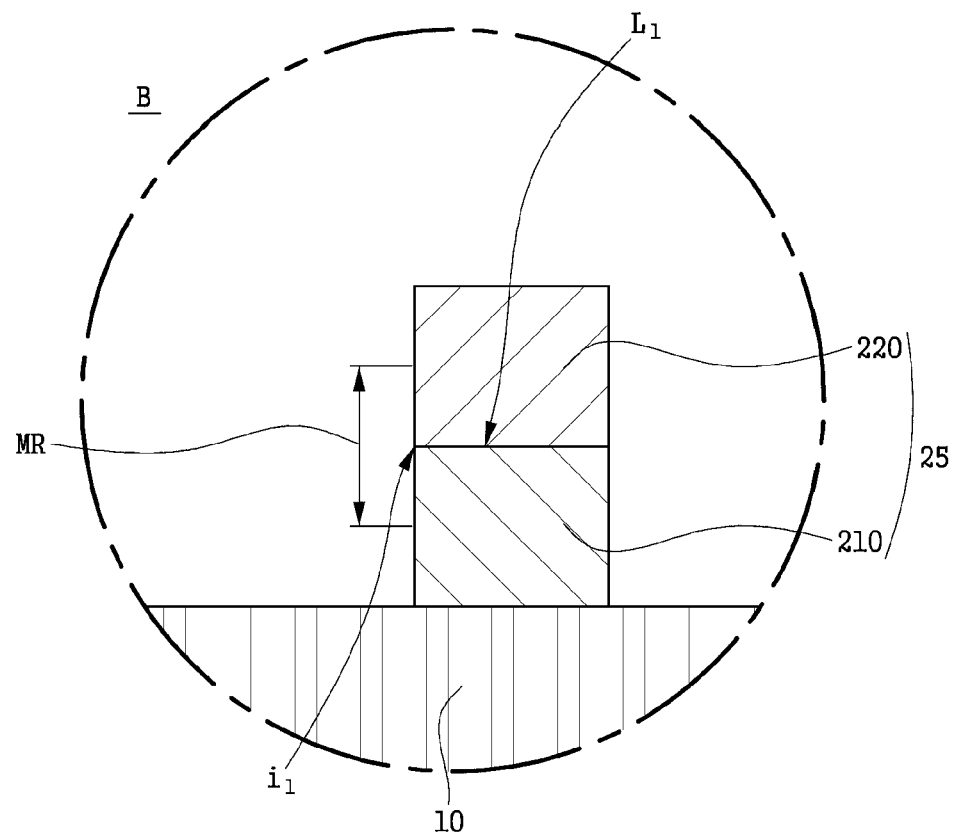
FIG. 9 is a magnified view of a portion indicated as B of FIG. 7.
Figure 10:
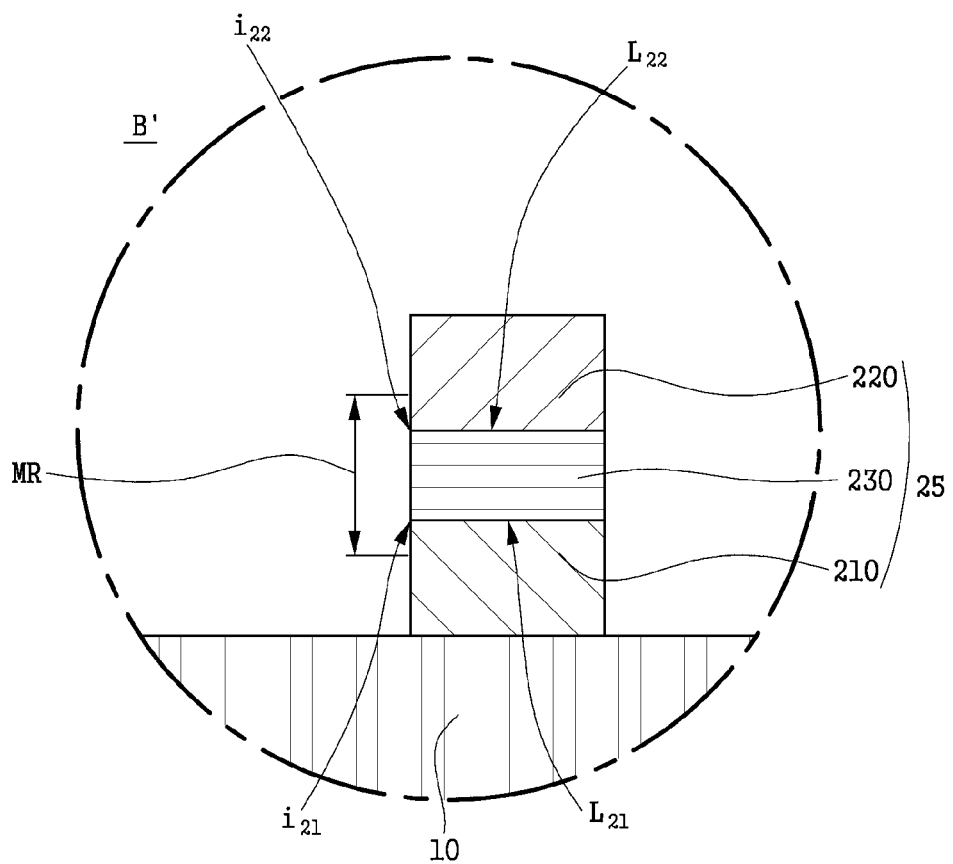
FIG. 10 is a magnified view of a portion indicated as B' of FIG. 8.

FIGS. 7 and 8 are conceptual views for illustrating a photomask according to another embodiment of the present disclosure. FIG. 9 is a magnified view of the portion indicated as B of FIG. 7. FIG. 10 is a magnified view of the portion indicated as B' of FIG. 8. Hereinafter, the following will be described with reference to FIG. 7 to FIG. 10.

Photomask

A photomask 2000 according to another embodiment includes a transparent substrate 10 and a multi-layer light shielding pattern film 25 disposed on the transparent substrate 10.

The multi-layer light shielding pattern film 25 includes a first light shielding film 210 and the second light shielding film 220 disposed on the first light shielding film 210, and including a transition metal and at least one selected from the group consisting of oxygen and nitrogen.

A side surface of the multi-layer light shielding pattern film 25 includes a measuring zone MR corresponding to the zone between a first spot spaced apart from a first point on an upper boundary of the first light shielding film 210 in a direction to a lower boundary of the first light shielding film 210 and a second spot spaced apart from a second point on a lower boundary of the second light shielding film 220 in a direction to an upper surface of the secondary light shielding film 220.

A surface roughness Wr of the measuring zone (MR) satisfies the condition of Equation 1 below:

$$0 \text{ nm} < Wr - Wo \leq 3 \text{ nm} \qquad \text{[Equation 1]}$$

In the Equation 1, the Wo is a surface roughness (unit: nm) of the measuring zone (MR) before soaking and washing processes, and the Wr is a surface roughness (unit: nm) of the measuring zone (MR) after the soaking and washing processes.

The SC-1 solution may include $NH_4OH$, $H_2O_2$, and $H_2O$. The SC-1 solution may include $NH_4OH$ of 14.3 wt %, $H_2O_2$ of 14.3 wt %, $H_2O$ of 71.4 wt % based on a total weight of the SC-1 solution. The photomask may be soaked in the SC-1 solution for 800 seconds. The photomask may be washed with a ozone water. The ozone water may include 20 ppm of ozone in an ultrapure water as a solvent based on a total weight of the ozone water.

The side surface of the multi-layer light shielding pattern film may include a measuring zone corresponded to the zone between a first spot spaced apart by 5 nm from a first point on the upper boundary of the first light shielding film in the direction to the lower boundary of the first light shielding film and a second spot spaced apart by 5 nm from a second point on the lower boundary of the second light shielding film in the direction to the upper boundary of the second light shielding film.

The structure, roughness characteristic, composition, thickness, and the like of the multi-layer light shielding pattern film 25 are overlapped with the description from the above photomask blank 1000 and omitted.

The photomask 2000 may be manufactured by patterning the photomask blank 1000 described above.

Manufacturing Method of Multi-Layer Light Shielding Film

The manufacturing method of a photomask blank according to one embodiment of the present disclosure includes a preparation operation of disposing a sputtering target including a transition metal and a transparent substrate in a sputtering chamber; and a multi-layer light shielding film formation operation of applying an electric power to the sputtering target and forming a multi-layer light shielding film on the transparent substrate.

The multi-layer light shielding film formation operation includes a first light shielding film formation operation of forming a first light shielding film on the transparent substrate; an adhesion strengthening layer formation operation of forming an adhesion strengthening layer on the formed first light shielding film; and an upper light shielding layer formation operation of forming a second light shielding film on the adhesion strengthening layer.

In the preparation operation, in consideration of the composition of the multi-layer light shielding film, a target applied to the formation of the multi-layer light shielding film can be selected. One target containing a transition metal may be applied as the sputtering target. Two or more targets including one target containing a transition metal may be applied as the sputtering target. The target containing a transition metal may include a transition metal in an amount of 90 at % or more. The target containing a transition metal may include a transition metal in an amount of 95 at % or more. The target containing a transition metal may include a transition metal in an amount of 99 at % or more.

The transition metal may include at least one selected from the group consisting of Cr, Ta, Ti and Hf. The transition metal may include Cr.

The description of the transparent substrate disposed in the sputtering chamber is overlapped with the above description and therefore omitted.

In the multi-layer light shielding film formation operation, the film formation process condition may be applied differently for each film or layer included in the multi-layer light shielding film. Particularly, in consideration of surface roughness characteristics, chemical resistance, extinction characteristics, and etching characteristics, and the like, the composition of atmospheric gas, the pressure in a chamber, the electric power applied to a sputtering target, the time for film formation, the rotation speed of a substrate, and the like may be applied differently for each film or layer.

The atmospheric gas may include an inert gas, a reactive gas, and a sputtering gas. The inert gas is a gas not including elements contained in a multi-layer light shielding film. The reactive gas is a gas including elements contained in a multi-layer light shielding film. The sputtering gas is a gas making collision with a target by being ionized in a plasma atmosphere. The inert gas may include helium (He). The reactive gas may include a gas including nitrogen. The gas including nitrogen may be for example, $N_2$, NO, $NO_2$, $N_2O$, $N_2O_3$, $N_2O_4$, $N_2O_5$ and the like. The reactive gas may include a gas including oxygen. The gas including oxygen may be for example, $O_2$ or $CO_2$. The reactive gas may include a gas including nitrogen and a gas including oxygen. The reactive gas may include a gas including nitrogen and oxygen. The gas including all the nitrogen and oxygen may be for example, NO, $NO_2$, $N_2O$, $N_2O_3$, $N_2O_4$, $N_2O_5$.

The sputtering gas may be argon (Ar) gas.

The power source for applying an electric power to a sputtering target may be DC power source, or RF power source.

In the first light shielding film formation process, the electric power applied to a sputtering target may be 1.5 to 2.5 kW. In the first light shielding film formation process, the electric power applied to a sputtering target may be 1.6 to 2 kW. In such a case, it is possible to help the multi-layer light shielding film to have stable durability.

In the first light film formation process, the ratio of the flow rate of reactive gas compared to the flow rate of inert gas in the atmospheric gas may be 1.5 to 3. The flow rate ratio may be 1.8 to 2.7. The flow rate ratio may be 2 to 2.5.

The ratio of the oxygen amount compared to the nitrogen amount included in the reactive gas may be 1.5 to 4. The ratio of the oxygen amount compared to the nitrogen amount included in the reactive gas may be 2 to 3. The ratio of the oxygen amount compared to the nitrogen amount included in the reactive gas may be 2.2 to 2.7.

In such a case, it is possible to help the multi-layer light shielding film to have a sufficient extinction characteristic. Additionally, the etching characteristic of the first light shielding film is controlled and it is possible to help the side surface of the patterned multi-layer light shielding film to have a shape close to be vertical from the surface of transparent substrate.

The film formation time of the first light shielding film may be for 200 to 300 seconds. The film formation time of the first light shielding film may be for 210 to 240 seconds. In such a case, it is possible to help the multi-layer light shielding film to have a sufficient extinction characteristic.

In the adhesion strengthening layer formation process, the adhesion strengthening layer may be formed in contact with the surface of the first light shielding film. The adhesion strengthening layer may be formed in contact with the surface of another thin film disposed on the first light shielding film.

In the adhesion strengthening layer formation process, the electric power applied to a sputtering target may be 1.5 to 2.5 kW. In the adhesion strengthening layer formation process, the electric power applied to a sputtering target may be 1.6 to 2 kW. In such a case, the roughness of the upper surface and lower surface of the adhesion strengthening layer is controlled in the predetermined range and it is possible to help the multi-layer light shielding film to have excellent durability in a cleaning process.

In the adhesion strengthening layer formation process, an electric power may be applied to a sputtering target after just 15 seconds or more from completion of the formation of a thin film disposed in contact with the lower surface of the adhesion strengthening layer, for example, the first light shielding film. In the adhesion strengthening layer formation process, an electric power may be applied to a sputtering target after just 20 seconds or more from the completion of the formation of the thin film. In the adhesion strengthening layer formation process, an electric power may be applied to a sputtering target after just not more than 30 seconds from the completion of the formation of the thin film. In such a case, the adhesion strengthening layer may help the multi-layer light shielding film to have more excellent durability against a cleaning solution.

In the adhesion strengthening layer formation process, the ratio of a flow rate of inert gas compared to a flow rate of reactive gas in a flow rate of atmospheric gas may be 0.2 to 0.8. The ratio may be 0.3 to 0.7. The ratio may be 0.35 to 0.6.

The ratio of the amount of the oxygen compared to the amount of the nitrogen included in the reactive gas may be 0.2 or less. The ratio of the amount of the oxygen compared to the amount of the nitrogen included in the reactive gas may be 0.1 or less. The ratio of the amount of the oxygen compared to the amount of the nitrogen included in the reactive gas may be 0.001 or more. In such a case, the surface roughness of the adhesion strengthening layer may have a higher value compared to the surface roughness of a target surface for the adhesion strengthening layer.

In the adhesion strengthening layer formation process, the atmospheric gas may be injected into a chamber within 10 seconds from the time when the atmospheric gas applied to the formation of a thin film disposed in contact with the lower surface of the adhesion strengthening layer is completely degassed from the sputtering chamber. In the adhesion strengthening layer formation process, the atmospheric gas may be injected into a chamber within 5 seconds from the time when the atmospheric gas applied to the formation of a thin film disposed in contact with the lower surface of the adhesion strengthening layer is completely degassed from the sputtering chamber.

The formation time of the adhesion strengthening layer may be for 1 to 15 seconds. The formation time of the adhesion strengthening layer may be for 2 to 8 seconds. In such a case, the surface roughness value may be easily controlled within a predetermined range, relatively.

The surface roughness Rsk value of the adhesion strengthening layer formed after the adhesion strengthening layer formation process may be −1 or less.

Rsk, Rku, Rq, Ra and Rz values are values evaluated in accordance with ISO_4287.

When the adhesion strengthening layer is observed in the section, the profile portion disposed in the upper portion of a reference line (refer to the average line of heights from the surface profile) within the surface profile of the adhesion strengthening layer is referred to as a peak, and the profile portion disposed in the lower portion of the reference line is referred to as a valley.

The Rsk value of the adhesion strengthening layer may be adjusted and thereby the degree of asymmetry of the surface profile is controlled. Through the above, an adhesion strength between thin films disposed on the adhesion strengthening layer or under the adhesion strengthening layer and the adhesion strengthening layer can be enhanced.

In the adhesion strengthening layer formation process, the surface roughness Rsk value of the strengthening layer formed may be −1 or less. The Rsk value may be −2 or less. The Rsk value may be −3 or more. In such a case, the multi-layer light shielding film can have excellent durability in a cleaning process.

In the adhesion strengthening layer formation process, the surface roughness Rku value of the adhesion strengthening layer formed may be 10 or more.

By adjusting the kurtosis degree of the peak and the valley of the adhesion strengthening layer, the contacting area between thin films disposed to be adjacent to the adhesion strengthening layer can be increased. Through this, the adhesion strength between thin films disposed in the adhesion strengthening layer and the adhesion strengthening layer can be improved.

The surface roughness Rku value of the adhesion strengthening layer formed in the adhesion strengthening layer formation process may be 10 or more. The Rku value may be 12 or more. The Rku value may be 15 or less. In such a case, the adhesion strength between films included in the multi-layer light shielding film may be increased.

The surface roughness Rq value of the adhesion strengthening layer formed in the adhesion strengthening layer formation process may be 0.2 nm or more. The Rq value may be 0.4 nm or more. The Rq value may be 5 nm or less. The Rq value may be 1.5 nm or less.

The surface roughness Ra value of the adhesion strengthening layer formed in the adhesion strengthening process formation process may be 0.1 nm or more. The Ra value may be 0.2 nm or more. The Ra value may be 1.5 nm or less. The Ra value may be 1 nm or less.

The surface roughness Ra value of the adhesion strengthening layer formed in the adhesion strengthening layer formation process may be 0.1 nm or more. The Ra value may be 0.2 nm or more. The Ra value may be 1.5 nm or less. The Ra value may be 1 nm or less.

The surface roughness Rz value of the adhesion strengthening layer formed in the adhesion strengthening layer formation process may be 4.5 nm or more. The Rz value may be 6 nm or more. The Rz value may be 20 nm or less. The Rz value may be 15 nm or less.

In such a case, an adhesion strengthening layer may increase an adhesion strength between thin films disposed to be adjacent with the adhesion strengthening layer.

In the film formation process of the upper light shielding layer, the electric power applied to a sputtering target may be 1 to 2 kW. In the film formation process of the upper light shielding layer, the electric power applied to a sputtering target may be 1.2 to 1.7 kW. In such a case, the upper light shielding layer may have a relatively low roughness characteristic, the occurrence of particles derived from unevenness of the surface of the multi-layer light shielding film can be suppressed.

In the upper light shielding layer formation process, an electric power may be applied to a sputtering target after 15 seconds or more from the completion of a thin film formation, as for example, to an adhesion strengthening layer. In the upper light shielding layer formation process, an electric power may be applied to a sputtering target after 20 seconds or more from the completion of a thin film formation disposed in contact with the lower surface of the upper light shielding layer. In the upper light shielding layer formation process, an electric power may be applied to a sputtering target within 30 seconds from the completion of the thin film formation. In such a case, the upper light shielding layer may have predetermined light shielding characteristics and etching characteristics.

In upper light shielding layer formation process, the ratio of the flow rate of reactive gas compared to the flow rate of inert gas may be 0.3 to 0.7. The flow rate ratio may be 0.4 to 0.6.

In the upper light shielding layer formation process, the ratio of the amount of the oxygen compared to the amount of the nitrogen included in the reactive gas may be 0.3 or less. The ratio of the amount of the oxygen compared to the amount of the nitrogen included in the reactive gas may be 0.1 or less. The ratio of amount of the oxygen compared to the amount of the nitrogen included in the reactive gas may be 0.001 or more.

In such a case, the etching speed of the upper light shielding layer may have a relatively lower value compared to the first light shielding film, and the side surface of the patterned multi-layer light shielding film may be formed relatively close to be vertical from the surface of the transparent substrate.

In the upper light shielding layer formation process, the atmospheric gas applied to an upper light shielding layer formation process can be injected within 10 seconds from the time when the atmospheric gas applied to the formation of a thin film (for example, an adhesion strengthening layer) disposed in contact with the lower surface of the upper light shielding layer is completely degassed from a sputtering chamber. In the upper light shielding layer formation process, the atmospheric gas applied to the upper light shielding layer formation process within 5 seconds from the time when the atmospheric gas applied to the formation of a thin film disposed in contact with the lower surface of the upper light shielding layer is completely degassed from a sputtering chamber. In such a case, it is possible to help the multi-layer light shielding film to have an excellent extinction characteristic, and it is possible to improve the convenience of controlling the shape of the patterned multi-layer light shielding film.

The formation process of the upper light shielding layer may be performed for 10 to 30 seconds. The formation process of the upper light shielding layer may be performed for to 25 seconds. In such a case, it is possible to help the side surface of the multi-layer light shielding pattern film to have a shape close to be vertical from the surface of the transparent substrate.

The multi-layer light shielding film manufactured through the manufacturing method includes the first light shielding film and the second light shielding film disposed on the first light shielding film. The second light shielding film may include the upper light shielding layer and the adhesion strengthening layer. The adhesion strengthening layer may be disposed between the upper light shielding layer and the first light shielding film. The description of the structure, the roughness characteristic, the composition, the film thickness, the optical properties, and the like of the multi-layer light shielding film is overlapped with the above description and thus omitted.

Manufacturing Method of Semiconductor Element

The method of manufacturing the semiconductor element according to another embodiment of the present disclosure includes: a preparation operation of disposing a light source, a photomask, and a semiconductor wafer, to which a resist film have been applied, in a sputtering chamber; an exposure operation of selectively transmitting an incident light from the light source through the photomask; and a developing operation of developing a pattern on the semiconductor wafer.

The photomask includes a transparent substrate and a multi-layer light shielding pattern film disposed on the transparent substrate.

The multi-layer light shielding pattern film includes a first light shielding film and a second light shielding film disposed on the first light shielding film, and including a transition metal and at least one selected from the group consisting of oxygen and nitrogen.

A side surface of the multi-layer light shielding pattern film includes a measuring zone corresponding to the zone between a first spot spaced apart from a first point on an upper boundary of the first light shielding film in a direction to the lower boundary of the first light shielding film and a second spot spaced apart from a second point on the lower boundary of the second light shielding film in a direction to an upper boundary of the second light shielding film.

The surface roughness Wr of the measuring zone satisfies the condition of Equation 1 below:

$$0 \text{ nm} < Wr - Wo \leq 3 \text{ nm} \quad \text{[Equation 1]}$$

In the Equation 1, the Wo is a surface roughness [unit: nm] of the measuring zone (MR) before soaking and cleaning processes, and the Wr is a surface roughness [unit: nm] of the measuring zone (MR) after soaking in SC-1 (standard clean-1) solution and washing with ozone water.

The SC-1 solution may be a solution including $NH_4OH$ of 14.3 wt %, $H_2O_2$ of 14.3 wt %, and $H_2O$ of 71.4 wt %, the ozone water may be a solution 20 ppm of ozone in an ultrafine water based on a total weight of the ozone water, and the photomask may be soaked in the SC-1 solution for 800 seconds.

In the preparation operation, the light source can generate an exposure light with a short wavelength. The exposure light may be a light with a wavelength of 200 nm. The exposure light may be ArF light with a wavelength of 193 nm.

A lens may be additionally disposed between the photomask and the semiconductor wafer. The lens has functionality of reducing a size of a circuit pattern shape on the photomask and thereby transferring thereof onto the semiconductor wafer. The lens is not limited, if the lens can be ordinarily applied to Arf semiconductor wafer exposure process. For example, the lens may be a lens consisting of calcium fluoride ($CaF_2$).

In the exposure operation, an exposure light can be selectively transmitted on the semiconductor safer through a photomask. In such a case, chemical modification may occur in a portion, where an exposure light reaches within a resist film.

In the developing operation, a pattern may be developed on a semiconductor wafer by treating the semiconductor wafer after the exposure operation with a developing solution. When an applied resist solution is a positive resist, a portion, where the exposure light reaches within the resist film may be dissolved by the developing solution. When the applied resist solution is a negative resist, a portion, where an exposure light does not reach within the resist film may be dissolved by the developing solution. The resist film is formed to be a resist pattern by treating with the developing solution. A pattern may be formed on the semiconductor wafer having the resist pattern as a mask.

The description of a photomask is overlapped and thus omitted.

Hereinafter, the detailed embodiment will be described in further detail.

Manufacturing Example: Formation of Multi-Layer Light Shielding

Example 1: A transparent substrate with a quartz material of a width of 6 inches, a length of 6 inches, and a thickness of 0.25 inches was disposed in a DC sputtering chamber. A chrome target was disposed in the chamber to have T/S distance of 255 mm, and an angle between a substrate and a target of 25 degrees.

Thereafter, an atmospheric gas mixed in a ratio of $Ar:N_2:CO_2=3:2:5$ was introduced into the chamber, wherein an electric power supplied to a sputtering target was 1.85 kW, the rotation speed of a substrate was 10 RPM, to operate a sputtering process for 200 to 250 seconds and forming the first light shielding film.

After the formation of the first light shielding film, the electric power supplied to a sputtering target was 1.85 kW, the rotation speed of the substrate was 10 RPM, and a sputtering process was performed for 5 seconds to form an adhesion strengthening layer. The electric power was applied to a sputtering target after 20 seconds from the completion of the first light shielding film formation, and the atmospheric gas was injected within 5 seconds from the time of completely degassing the atmospheric gas applied to the formation of the first light shielding film.

Example 2: While a sputtering process proceeded under the same condition as Example 1, when an adhesion strengthening layer was formed, the atmospheric gas mixed in the volume ratio of $Ar:N_2=7:3$ was introduced, and the electric power supplied to a sputtering target was applied to be 1.83 kW.

Comparative Example 1: While a sputtering process proceeded under the same condition as Example 1, when an adhesion strengthening layer was formed, an atmospheric gas mixed in the volume ratio of $Ar:N_2:O_2=5:4:1$ was introduced into a chamber, and an electric power applied to a sputtering target may be applied to be 1.8 kW.

Comparative Example 2: While a sputtering process proceeded under the same condition as Example 1, when an adhesion strengthening layer was formed, an atmosphere gas mixed in a volume ratio of $Ar:N_2=5.5:4.5$ was introduced, an electric power applied to a sputtering target was applied to be 1 kW, and a sputtering process was performed for 8 seconds.

Example 3: A first light shielding film and an adhesive strengthening layer were formed under the same condition as Example 1. An atmospheric gas mixed in a volume ratio of $Ar:N_2=6.5:3.5$ was introduced into a chamber, the electric power supplied to a sputtering target was 1.5 kW, the rotation speed of a substrate was 10 RPM, and thereby the upper light shielding layer was formed by performing a sputtering process for 10 to 30 seconds. The electric power applied to the sputtering target was applied after 20 seconds from the completion of the adhesion strengthening layer formation, and the atmospheric gas was injected within 5 seconds after complete exhaustion of the atmospheric gas applied to the formation of the adhesion strengthening layer.

Example 4: A first light shielding film and an adhesive strengthening layer were formed under the same condition as Example 2. An atmospheric gas, which had been mixed in the volume ratio of $Ar:N_2=6.5:3.5$, was introduced into a chamber, the electric power supplied to a sputtering target was 1.5 kW, the rotation speed of a substrate was 10 RPM, and a sputtering process was performed for 10 to 30 seconds, thereby forming an upper light shielding layer.

Comparative Example 3: A first light shielding film and an adhesive strengthening layer were formed under the same condition as Example 2. And an atmospheric gas, which had been mixed in the volume ratio of $Ar:N_2=6.5:3.5$, was introduced into a chamber, the electric power supplied to a sputtering target was 1.5 kW, the rotation speed of a substrate was 10 RPM, and a sputtering process was performed for 10 to 30 seconds, thereby forming an upper light shielding layer.

Comparative Example 4: A first light shielding film and an adhesive strengthening layer were formed under the same condition as Example 2. An atmospheric gas, which had been mixed in the volume ratio of $Ar:N_2=6.5:3.5$, was introduced into a chamber, the electric power supplied to a sputtering target was 1.5 kW, the rotation speed of a substrate was 10 RPM, and a sputtering process was performed for 10 to 30 seconds, thereby forming an upper light shielding layer.

Comparative Example 5: A first light shielding film was formed under the same condition as the condition of Example 1, on a transparent substrate.

Comparative Example 6: A first light shielding film was formed under the same condition as the condition of Example 3, on a transparent substrate. Thereafter, an upper light shielding layer was formed on the first light shielding film under the same condition as the condition of the upper light shielding layer formation of Example 3.

The conditions for film formation of each Examples or Comparative Examples are described in Table 1 below.

Evaluation Example: Measurement of Surface Roughness

The Rq, Ra and Rz values for roughness of the surface of the adhesion strengthening layer of Examples 1 and 2 and Comparative examples 1 and 2 were measured in accordance with ISO 4287.

Additionally, the Rsk and Rku values for an upper surface roughness of the adhesion strengthening layer of Example 1, the first light shielding film of Comparative Example 5, and the upper light shielding layer of Comparative Example 6 were measured in accordance with ISO_4587.

In detail, XE-150 model available from PARK SYSTEM applied with PPP-NCHR, which is Cantilever model available from PARK SYSTEM, was used as a probe in an area with a width of 1 μm and a length of 1 μm, and the above roughness parameter values of each Example or Comparative Example were measured in Non-contact mode with a scan speed of 0.5 Hz.

The measured results of each Example and Comparative Example are described in Table 2 below.

Evaluation Example: Measurement of Each Film or Layer

The thicknesses of the first light shielding film, the adhesion strengthening layer, and the upper light shielding layer were measured for the samples of Examples and Comparative Examples described above. In detail, the samples of each Example and Comparative Example were processed to be a size of 15 mm width and length. Thereafter, the upper surface of the processed sample was treated by FIB (Focused Ion Beam), and subsequently, the TEM image of the section of the sample was measured with JEM-2100F HR model. The thickness of each film or each layer was measured from the measured TEM image.

Measured results of each Example or Comparative Example are described in Table 3 below.

Evaluation Example: Measurement of the Lower Surface Roughness of the Second Light Shielding Film After the samples of Examples 3 and 4, and Comparative Examples 3 and 4 were cut, the sectional images of the samples were measured through TEM. In detail, the samples were processed to be a size of 15 mm width and length, subsequently, the surface of the processed sample was treated by FIB (Focused Ion Beam), and the TEM image of the processed sample was measured with JEM-2100F HR model available from JEOL Ltd. After that, the interface of the second light shielding film and the first light shielding film was traced from the measured image, and the Rz value of the lower surface of the second light shielding film was calculated from the traced line, in accordance with the calculating method of Rz value standardized in ISO 4287.

When the calculated Rz values of each Example or Comparative Example were 4 nm or less, the Example or Comparative Example was evaluated as O, and when the calculated Rz values were more than 4 nm, the Example or Comparative example was evaluated as X, to be described in Table 2.

Evaluation Example: Measurement of Multi-Layer Light Shielding Film Optical Properties The transmittance and optical density values of the samples of Examples 3 and 4, and Comparative Examples 3 and 4 were measured for an exposure light with a wavelength of 193 nm. In detail, the transmittance and optical density values of Examples and Comparative Examples were measured for an exposure light with a wavelength of 193 nm, by using MG-PRO model available from NANO-VIEW.

The measured results of Examples and Comparative Examples are described in Table 3 below.

Evaluation Example: Measurement of the Composition of Each Layer of Multi-Layer Light Shielding Film The amounts by elements in each layer or each film of Examples and Comparative Examples were measured by using XPS analysis. Specifically, blank masks of each Example or Comparative Example were processed to be a size of 15 mm width and length and thereby respective samples were prepared. The samples were arranged in a measuring device of K-Alpha model available from THERMO SCIENTIFIC, and subsequently, the area with a width of 4 mm and a length of 2 mm placed in the center of each sample was etched, to measure the amount by elements of each layer or each film. The measured results by Examples and Comparative Examples are described in Table 4 below.

Evaluation Example: Measurement of Roughness after and Before Cleaning of the Side Surface of Multi-Layer Light Shielding Pattern Film Wr value and Wo value of the samples of Examples 3 and 4, and Comparative Examples 3 and 4 were measured. In detail, the multi-layer light shielding films of the samples of Examples 3 and 4, and Comparative Examples 3 and 4 were patterned to be formed into multi-layer light shielding pattern films. Thereafter, respective samples were processed to be a size of 15 mm width and length, the surfaces of the processed samples were treated by FIB (Focused Ion Beam), and the TEM images of the processed samples were measured with JEM-2100F HR model available from JEOL Ltd. For the TEM images, the profile of a portion corresponding to a measuring zone within a side surface of the multi-layer light shielding film was traced, and the Wo value was calculated from the traced line in accordance with the calculating method of Ry standardized in ISO 4287.

Thereafter, the sample including the multi-layer light shielding pattern film was soaked for 800 seconds in SC-1 solution including $NH_4OH$ of 14.3 wt %, $H_2O_2$ of 14.3 wt %, and $H_2O$ of 71.4 wt %, and subsequently, a rinsing through ozone water including ozone of 20 ppm (based on the weight) with ultrapure water as a solvent was performed. The Wr value of the sample after the cleaning process was calculated by the same method as the method of calculating Wo value.

The measured results by Examples and Comparative Examples are described in Table 3 below.

TABLE 1

| | Type of Layer/Film | Electric Power of Sputtering (kW) | Rotation Speed of Substrate (RPM) | Time for Film Formation (Second) | Flow rate Ratio of Atmospheric Gas |
|---|---|---|---|---|---|
| Example 1 | Adhesion Strengthening Layer | 1.85 | 10 | 5 | $Ar:N_2 = 6.5:3.5$ |
| | First Light shielding Film | 1.85 | 10 | 200 to 250 | $Ar:N_2:CO_2 = 3:2:5$ |
| Example 2 | Adhesion Strengthening Layer | 1.83 | 10 | 5 | $Ar:N_2 = 7:3$ |
| | First Light shielding Film | 1.85 | 10 | 200 to 250 | $Ar:N_2:CO_2 = 3:2:5$ |
| Example 3 | Upper Light shielding Layer | 1.5 | 10 | 10 to 30 | $Ar:N_2 = 6.5:3.5$ |
| | Adhesion Strengthening Layer | 1.85 | 10 | 5 | $Ar:N_2 = 6.5:3.5$ |
| | First Light shielding Film | 1.85 | 10 | 200 to 250 | $Ar:N_2:CO_2 = 3:2:5$ |
| Example 4 | Upper Light shielding Layer | 1.5 | 10 | 10 to 30 | $Ar:N_2 = 6.5:3.5$ |
| | Adhesion Strengthening Layer | 1.83 | 10 | 5 | $Ar:N_2 = 7:3$ |
| | First Light shielding Film | 1.85 | 10 | 200 to 250 | $Ar:N_2:CO_2 = 3:2:5$ |
| Comparative Example 1 | Adhesion Strengthening Layer | 1.8 | 10 | 5 | $Ar:N_2:O_2 = 5:4:1$ |
| | First Light shielding Film | 1.85 | 10 | 200 to 250 | $Ar:N_2:CO_2 = 3:2:5$ |
| Comparative Example 2 | Adhesion Strengthening Layer | 1 | 5 | 8 | $Ar:N_2 = 5.5:4.5$ |
| | First Light shielding Film | 1.85 | 10 | 200 to 250 | $Ar:N_2:CO_2 = 3:2:5$ |
| Comparative Example 3 | Upper Light shielding Layer | 1.5 | 10 | 10 to 30 | $Ar:N_2 = 6.5:3.5$ |
| | Adhesion Strengthening Layer | 1.8 | 10 | 5 | $Ar:N_2:O_2 = 5:4:1$ |
| | First Light shielding Film | 1.85 | 10 | 200 to 250 | $Ar:N_2:CO_2 = 3:2:5$ |
| Comparative Example 4 | Upper Light shielding Layer | 1.5 | 10 | 10 to 30 | $Ar:N_2 = 6.5:3.5$ |
| | Adhesion Strengthening Layer | 1 | 5 | 8 | $Ar:N_2 = 5.5:4.5$ |
| | First Light shielding Film | 1.85 | 10 | 200 to 250 | $Ar:N_2:CO_2 = 3:2:5$ |

TABLE 1-continued

|  | Type of Layer/Film | Electric Power of Sputtering (kW) | Rotation Speed of Substrate (RPM) | Time for Film Formation (Second) | Flow rate Ratio of Atmospheric Gas |
|---|---|---|---|---|---|
| Comparative Example 5 | First Light shielding Film | 1.85 | 10 | 200 to 250 | Ar:N$_2$:CO$_2$ = 3:2:5 |
| Comparative Example 6 | Upper Light shielding Layer | 1.5 | 10 | 10 to 30 | Ar:N$_2$ = 6.5:3.5 |
|  | First Light shielding Film | 1.85 | 10 | 200 to 250 | Ar:N$_2$:CO$_2$ = 3:2:5 |

TABLE 2

|  | Thin Film as Measuring Target | Rsk | Rku | Rq (nm) | Ra (nm) | Rz (nm) |
|---|---|---|---|---|---|---|
| Example 1 | Adhesion Strengthening Layer | −2.569 | 14.006 | 0.944 | 0.704 | 7.366 |
| Example 2 | Adhesion Strengthening Layer | — | — | 1.067 | 0.724 | 9.274 |
| Example 3 | Upper Light shielding Layer | — | — | — | — | — |
| Example 4 | Upper Light shielding Layer | — | — | — | — | — |
| Comparative Example 1 | Adhesion Strengthening Layer | — | — | 0.355 | 0.248 | 5.047 |
| Comparative Example 2 | Adhesion Strengthening Layer | — | — | 0.144 | 0.114 | 1.197 |
| Comparative Example 3 | Upper Light shielding Layer | — | — | — | — | — |
| Comparative Example 4 | Upper Light shielding Layer | — | — | — | — | — |
| Comparative Example 5 | First Light shielding Film | −0.623 | 3.318 | — | — | — |
| Comparative Example 6 | Upper Light shielding Layer | −0.529 | 3.015 | — | — | — |

TABLE 3

|  | Type of Layer/Film | Thickness (Å) | Roughness of the Lower Surface of Second Light shielding Layer (nm) | Transmittance (%) | Optical Density | Wr-Wo (nm) |
|---|---|---|---|---|---|---|
| Example 1 | Adhesion Strengthening Layer | 15 | — | — | — | — |
|  | First Light shielding Film | 460 |  |  |  |  |
| Example 2 | Adhesion Strengthening Layer | 15 | — | — | — | — |
|  | First Light shielding Film | 460 |  |  |  |  |
| Example 3 | Upper Light shielding Layer | 60 | 4.6 | 1 | 1.95 | 0.5 |
|  | Adhesion Strengthening Layer | 15 |  |  |  |  |
|  | First Light shielding Film | 460 |  |  |  |  |
| Example 4 | Upper Light shielding Layer | 60 | 4.5 | 1.1 | 1.95 | 0.7 |
|  | Adhesion Strengthening Layer | 15 |  |  |  |  |
|  | First Light shielding Film | 460 |  |  |  |  |
| Comparative Example 1 | Adhesion Strengthening Layer | 10 | — | — | — | — |
|  | First Light shielding Film | 460 |  |  |  |  |

TABLE 3-continued

| | Type of Layer/Film | Thickness (Å) | Roughness of the Lower Surface of Second Light shielding Layer (nm) | Transmittance (%) | Optical Density | Wr-Wo (nm) |
|---|---|---|---|---|---|---|
| Comparative Example 2 | Adhesion Strengthening Layer | 15 | — | — | — | — |
| | First Light shielding Film | 460 | | | | |
| Comparatve Example 3 | Upper Light shielding Layer | 60 | 2.3 | 1.56 | 1.75 | 3.3 |
| | Adhesion Strengthening Layer | 10 | | | | |
| | First Light shielding Film | 460 | | | | |
| Comparative Example 4 | Upper Light shielding Layer | 60 | 1.9 | 1.5 | 1.79 | 3.8 |
| | Adhesion Strengthening Layer | 15 | | | | |
| | First Light shielding Film | 460 | | | | |
| Comparative Example 5 | First Light shielding Film | 460 | — | — | — | — |
| Comparative Example 6 | Upper Light shielding Layer | 60 | 1.5 | 1.43 | 1.85 | 3.94 |
| | First Light shielding Film | 460 | | | | |

TABLE 4

| | Type of Layer/Film | The Amount of Element (at %) | | | |
|---|---|---|---|---|---|
| | | Cr | O | C | N |
| Example 1 | Adhesion Strengthening Layer | 60 | 17 | 5 | 19 |
| | First Light shielding Film | 40 | 41 | 10 | 9 |
| Example 2 | Adhesion Strengthening Layer | 62 | 17 | 5 | 17 |
| | First Light shielding Film | 40 | 41 | 10 | 9 |
| Example 3 | Upper Light shielding Layer | 59 | 17 | 6 | 19 |
| | Adhesion Strengthening Layer | 60 | 17 | 5 | 19 |
| | First Light shielding Film | 40 | 41 | 10 | 9 |
| Example 4 | Upper Light shielding Layer | 59 | 17 | 6 | 19 |
| | Adhesion Strengthening Layer | 62 | 17 | 5 | 17 |
| | First Light shielding Film | 40 | 41 | 10 | 9 |
| Comparative Example 1 | Adhesion Strengthening Layer | 60 | 17 | 5 | 19 |
| | First Light shielding Film | 40 | 41 | 10 | 9 |
| Comparative Example 2 | Adhesion Strengthening Layer | 40 | 15 | 7 | 38 |
| | First Light shielding Film | 40 | 41 | 10 | 9 |
| Comparative Example 3 | Upper Light shielding Layer | 59 | 17 | 6 | 19 |
| | Adhesion Strengthening Layer | 60 | 17 | 5 | 19 |
| | First Light shielding Film | 40 | 41 | 10 | 9 |
| Comparative Example 4 | Upper Light shielding Layer | 59 | 17 | 6 | 19 |
| | Adhesion Strengthening Layer | 40 | 15 | 7 | 38 |
| | First Light shielding Film | 40 | 41 | 10 | 9 |
| Comparative Example 5 | First Light shielding Film | 40 | 41 | 10 | 9 |
| Comparative Example 6 | Upper Light shielding Layer | 59 | 17 | 6 | 19 |
| | First Light shielding Film | 40 | 41 | 10 | 9 |

In the Table 2, it was shown that the surface of the adhesion strengthening layer of Example 1 had a relatively low Rsk value and a relatively high Rku value, when compared to Comparative Examples 5 and 6. Also, it was shown that Examples 1 and 2 had relatively high Rq, Ra and Rz values compared to Comparative Examples 1 and 2.

In the Table 3, the roughness of the lower surface of the second light shielding film of Examples 3 and 4 was evaluated as 1 nm or less, and the roughness of the lower surface of Comparative Examples 3, 4 and 6 was evaluated as 3 nm or more.

The transmittance for a light with a wavelength of 193 nm or less of Examples 3 and 4 was measured to be 1.1% or less, however, the transmittance for a light with a wavelength of 193 nm or less of Comparative Examples 3, 4 and 6 was measured to be 1.4% or more. The optical density for a light with a wavelength of 193 nm or less of Examples 3 and 4 was measured to be 1.9 or more, however, the optical density for a light with a wavelength of 193 nm or less of Comparative Examples 3, 4 and 6 was measured to be less than 1.9.

The Wr–Wo values of Examples 3 and 4 were evaluated as 0, and the Wr–Wo values of Comparative Examples 3 and 4 were evaluated as X.

In the Table 4, the Cr amount of an adhesion strengthening layer of Example was measured to have a higher value compared to the Cr amount of a first light shielding film. However, the Cr amount of an adhesion strengthening layer of Comparative Examples 2 and 4 was measured not to have a higher value compared to the Cr amount of the first light shielding film.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A photomask blank comprising:
a transparent substrate; and
a multi-layer light shielding film disposed on the transparent substrate, wherein the multi-layer light shielding film comprises:
 a first light shielding film; and
 a second light shielding film disposed on the first light shielding film and comprising a transition metal and at least one selected from the group consisting of oxygen and nitrogen,
wherein the second light shielding film comprises an upper light shielding layer and an adhesion strengthening layer disposed between the upper light shielding layer and the first light shielding film,
wherein the first light shielding film comprises a transition metal in an amount of 35 to 55 at %, and
wherein the second light shielding film comprises the transition metal in an amount of 55 to 75 at %,
wherein the second light shielding film is disposed as an uppermost surface of the multi-layer light shielding film,
wherein a side surface of the multi-layer light shielding film comprises a measuring zone corresponding to a zone between a first spot spaced apart from a first point on an upper boundary of the first light shielding film in a direction to a lower boundary of the first light shielding film and a second spot spaced apart from a second point on a lower boundary of the second light shielding film in a direction to an upper boundary of the second light shielding film,
wherein a surface roughness Wr of the measuring zone satisfies Equation 1 below:

$$0 \text{ nm} < Wr - Wo \leq 3 \text{ nm} \qquad \text{[Equation 1]}$$

where, in the Equation 1 above, Wo is a surface roughness of the measuring zone before soaking and washing processes, Wr is a surface roughness of the measuring zone after soaking in SC-1 (standard clean-1) solution and washing with ozone water, and the SC-1 solution comprises $NH_4OH$, $H_2O_2$, and $H_2O$,
wherein the adhesion strengthening layer comprises a transition metal, and an amount of the transition metal in the adhesion strengthening layer is higher than an amount of the transition metal in the first light shielding film,
wherein a composition of the first light shielding film is different from a composition of the second light shielding film,
wherein the SC-1 solution comprises $NH_4OH$ of 14.3 wt %, $H_2O_2$ of 14.3 wt %, $H_2O$ of 71.4 wt % based on a total weight of the SC-1 solution,
wherein the photomask is soaked in the SC-1 solution for 800 seconds, and
wherein the ozone water comprises 20 ppm of ozone in an ultrapure water based on a total weight of the ozone water,
wherein an amount of the transition metal in the adhesion strengthening layer is greater than an amount of the transition metal in the upper light shielding layer, and
wherein a ratio of a thickness of the adhesion strengthening layer compared to a thickness of the first light shielding film is 0.005 to 0.05.

2. The photomask blank of claim 1, wherein the first spot is spaced apart from the first point by 5 nm and the second spot is spaced apart from the second point by 5 nm.

3. The photomask blank of claim 1, wherein the first light shielding film and the second light shielding film are disposed to form an interface between the first light shielding film and the second light shielding film, and
wherein the surface roughness (Wr) is the greatest in the measuring zone corresponding to a zone comprising the interface.

4. The photomask blank of claim 1, wherein a roughness (Rz) of a lower surface of the second light shielding film is 4 nm or more.

5. The photomask blank of claim 1, wherein one or more of the first light shielding film and the second light shielding film comprise a transition metal, oxygen, and nitrogen, respectively.

6. The photomask blank of claim 5, wherein a sum of an amount of the oxygen and an amount of the nitrogen in the first light shielding film is 40 to 65 at %, and
wherein a sum of an amount of the oxygen and an amount of the nitrogen in the second light shielding film is 20 to 45 at %.

7. The photomask blank of claim 5, wherein the transition metal comprises at least one selected from the group consisting of Cr, Ta, Ti, and Hf.

8. The photomask blank of claim 1, wherein a ratio of the amount of the transition metal in the adhesion strengthening layer compared to the amount of the transition metal in the first light shielding film is 1.1 to 2.5.

9. The photomask blank of claim 1, wherein a thickness of the adhesion strengthening layer is 5 to 25 Å.

10. The photomask blank of claim 1, wherein a height skewness (Rsk) of an upper surface of the adhesion strengthening layer after formation of the adhesion strengthening layer is −1 or less.

11. The photomask blank of claim 1, wherein a kurtosis (Rku) of an upper surface of the adhesion strengthening layer after formation of the adhesion strengthening layer is 7 or more.

12. The photomask blank of claim 1, wherein an average of surface heights (Ra) measured across an upper surface of the adhesion strengthening layer just after formation of the adhesion strengthening layer is 0.5 nm or more.

13. The photomask blank of claim 1, wherein a mean roughness depth (Rz) of an upper surface of the adhesion strengthening layer after formation of the adhesion strengthening layer is 6 nm or more.

14. A photomask comprising:
a transparent substrate; and
a multi-layer light shielding pattern film disposed on the transparent substrate,
wherein the multi-layer light shielding pattern film comprises:
 a first light shielding film; and
 a second light shielding film disposed on the first light shielding film and comprising a transition metal and at least one selected from the group consisting of oxygen and nitrogen,
wherein the second light shielding film comprises an upper light shielding layer and an adhesion strengthening layer disposed between the upper light shielding layer and the first light shielding film,
wherein the first light shielding film comprises a transition metal in an amount of 35 to 55 at %, and
wherein the second light shielding film comprises the transition metal in an amount of 55 to 75 at %,
wherein the second light shielding film is disposed as an uppermost surface of the multi-layer light shielding film,
wherein a side surface of the multi-layer light shielding pattern film comprises a measuring zone corresponding to a zone between a first spot spaced apart from a first point on an upper boundary of the first light shielding film in a direction to a lower boundary of the first light shielding film and a second spot spaced apart from a second point on a lower boundary of the second light shielding film in a direction to an upper boundary of the second light shielding film,
wherein a surface roughness Wr of the measuring zone satisfies Equation 1 below:

$$0 \text{ nm} < Wr - Wo \leq 3 \text{ nm} \quad \text{[Equation 1]}$$

where, in the Equation 1 above, Wo is a surface roughness of the measuring zone before soaking and washing processes, Wr is a surface roughness of the measuring zone after soaking in SC-1 (standard clean-1) solution and washing with ozone water, and the SC-1 solution comprises $NH_4OH$, $H_2O_2$, and $H_2O$,
wherein the adhesion strengthening layer comprises a transition metal, and an amount of the transition metal in the adhesion strengthening layer is higher than an amount of the transition metal in the first light shielding film,
wherein a composition of the first light shielding film is different from a composition of the second light shielding film,
wherein the SC-1 solution comprises $NH_4OH$ of 14.3 wt %, $H_2O_2$ of 14.3 wt %, $H_2O$ of 71.4 wt % based on a total weight of the SC-1 solution,
wherein the photomask is soaked in the SC-1 solution for 800 seconds, and
wherein the ozone water comprises 20 ppm of ozone in an ultrapure water based on a total weight of the ozone water,
wherein an amount of the transition metal in the adhesion strengthening layer is greater than an amount of the transition metal in the upper light shielding layer, and
wherein a ratio of a thickness of the adhesion strengthening layer compared to a thickness of the first light shielding film is 0.005 to 0.05.

15. A method of manufacturing a semiconductor element, the method comprising:
disposing a light source, a photomask, and a semiconductor wafer, on which a resist film has been applied in a sputtering chamber;
selectively transmitting an incident light from the light source through the photomask; and
developing a pattern on the semiconductor wafer,
wherein the photomask comprises:
 a transparent substrate; and
 a multi-layer light shielding pattern film disposed on the transparent substrate, wherein the multi-layer light shielding pattern film comprises:
  a first light shielding film; and
  a second light shielding film disposed on the first light shielding film and comprising a transition metal and at least one selected from the group consisting of oxygen and nitrogen,
wherein the second light shielding film comprises an upper light shielding layer and an adhesion strengthening layer disposed between the upper light shielding layer and the first light shielding film,
wherein the first light shielding film comprises a transition metal in an amount of 35 to 55 at %, and
wherein the second light shielding film comprises the transition metal in an amount of 55 to 75 at %,
wherein the second light shielding film is disposed as an uppermost surface of the multi-layer light shielding film,
wherein a side surface of the multi-layer light shielding pattern film comprises a measuring zone corresponding to a zone between a first spot spaced apart from a first point on an upper boundary of the first light shielding film in a direction to a lower boundary of the first light shielding film and a second spot spaced apart from a second point on a lower boundary of the second light shielding film in a direction to an upper boundary of the second light shielding film,
wherein a surface roughness Wr of the measuring zone satisfies Equation 1 below:

$$0 \text{ nm} < Wr - Wo \leq 3 \text{ nm} \quad \text{[Equation 1]}$$

where, in the Equation 1 above, Wo is a surface roughness of the measuring zone before soaking and washing processes, Wr is a surface roughness of the measuring zone after soaking in SC-1 (standard clean-1) solution and washing with ozone water, and the SC-1 solution comprises $NH_4OH$, $H_2O_2$, and $H_2O$, wherein the adhesion strengthening layer comprises a transition metal, and an amount of the transition metal in the adhesion strengthening layer is higher than an amount of the transition metal in the first light shielding film, wherein a composition of the first light shielding film is different from a composition of the second light shielding film, wherein the SC-1 solution comprises $NH_4OH$ of 14.3 wt %, $H_2O_2$ of 14.3 wt %, $H_2O$ of 71.4 wt % based on a total weight of the SC-1 solution, wherein the photomask is soaked in the SC-1 solution for 800 seconds, wherein the ozone water comprises 20 ppm of ozone in an ultrapure water based on a total weight of the ozone water, wherein an amount of the transition metal in the adhesion strengthening layer is greater than an amount of the transition metal in the upper light shielding layer, and wherein a ratio of a thickness of the adhesion strengthening layer compared to a thickness of the first light shielding film is 0.005 to 0.05.

* * * * *